US012603142B2

(12) United States Patent
Yang et al.

(10) Patent No.: US 12,603,142 B2
(45) Date of Patent: Apr. 14, 2026

(54) SHIFT REGISTER UNIT, GATE DRIVING CIRCUIT INCLUDING THE SHIFT REGISTER UNIT AND DISPLAY PANEL INCLUDING THE GATE DRIVING CIRCUIT

(71) Applicants:Chengdu BOE Optoelectronics Technology Co., Ltd., Chengdu (CN); BOE Technology Group Co., Ltd., Beijing (CN)

(72) Inventors: Bo Yang, Beijing (CN); Kewen Zeng, Beijing (CN); Zhangmin Wu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 243 days.

(21) Appl. No.: 17/913,461

(22) PCT Filed: Nov. 19, 2021

(86) PCT No.: PCT/CN2021/131758
§ 371 (c)(1),
(2) Date: Sep. 22, 2022

(87) PCT Pub. No.: WO2022/199077
PCT Pub. Date: Sep. 29, 2022

(65) Prior Publication Data
US 2024/0221849 A1     Jul. 4, 2024

(30) Foreign Application Priority Data

Mar. 23, 2021     (CN) .......................... 202110308511.X

(51) Int. Cl.
*G11C 19/28* (2006.01)
*G09G 3/3233* (2016.01)

(52) U.S. Cl.
CPC ........... *G11C 19/28* (2013.01); *G09G 3/3233* (2013.01); *G09G 2300/0465* (2013.01);
(Continued)

(58) Field of Classification Search
CPC ................. G11C 19/28; G09G 3/3233; G09G 2300/0465; G09G 2300/0819;
(Continued)

(56) References Cited

U.S. PATENT DOCUMENTS

| | | | | |
|---|---|---|---|---|
| 2016/0171933 A1* | 6/2016 | Takahara | ............. | G09G 3/3233 |
| | | | | 345/212 |
| 2020/0002029 A1* | 1/2020 | Gonidou | ................ | B64G 1/643 |
| 2021/0358438 A1* | 11/2021 | Weng | ................... | G09G 3/3677 |

FOREIGN PATENT DOCUMENTS

| | | | | |
|---|---|---|---|---|
| CN | 104900268 A | 9/2015 | | |
| CN | 111145823 A | * 5/2020 | ............... | G09G 3/20 |

(Continued)

OTHER PUBLICATIONS

Li et al., Machine Translation of Foreign Patent Document CN111145823A, Shift register, gate drive circuit, display panel and display device, May 12, 2020, pp. 1-67 (Year: 2020).*

(Continued)

*Primary Examiner* — Amr A Awad
*Assistant Examiner* — Maheen I Javed
(74) *Attorney, Agent, or Firm* — XSENSUS LLP

(57) ABSTRACT

The present disclosure relates to a shift register unit, a gate driving circuit and a display panel. The shift register unit includes a first shift register circuit and a second shift register circuit. The first shift register circuit is coupled to a signal terminal group and a first output terminal, and is (Continued)

configured to output a first shift signal to the first output terminal in response to a signal of the signal terminal group. The second shift register circuit is coupled with the first shift register circuit, and the second shift register circuit is coupled to the signal terminal group and a second output terminal, and is configured to output a second shift signal to the second output terminal in response to the signal of the signal terminal group, An active level of the first shift signal and an active level of the second shift signal are logically opposite.

18 Claims, 11 Drawing Sheets

(52) U.S. Cl.
CPC ............... *G09G 2300/0819* (2013.01); *G09G 2300/0842* (2013.01); *G09G 2310/0286* (2013.01); *G09G 2310/08* (2013.01)

(58) Field of Classification Search
CPC ... G09G 2300/0842; G09G 2310/0286; G09G 2310/08; G09G 3/20; G09G 3/3266
See application file for complete search history.

(56) References Cited

FOREIGN PATENT DOCUMENTS

| | | | | |
|---|---|---|---|---|
| CN | 111243649 A | 6/2020 | | |
| CN | 111445854 A | 7/2020 | | |
| CN | 113053448 A | 6/2021 | | |
| EP | 3736803 A1 | 11/2020 | | |
| WO | WO-2019134412 A1 * | 7/2019 | ............... | G09G 3/20 |
| WO | 2021/227788 A1 | 11/2021 | | |

OTHER PUBLICATIONS

International Search Report and Written Opinion mailed on Feb. 15, 2022, in corresponding PCT/CN2021/131758, 6 pages.

* cited by examiner

SHIFT REGISTER UNIT, GATE DRIVING CIRCUIT INCLUDING THE SHIFT REGISTER UNIT AND DISPLAY PANEL INCLUDING THE GATE DRIVING CIRCUIT

CROSS-REFERENCE TO RELATED APPLICATIONS

The present application is the 371 application of PCT Application No. PCT/CN2021/131758, filed on Nov. 19, 2021, which is based upon and claims the priority to the Chinese Patent Application NO. 202110308511.X, entitled "SHIFT REGISTER UNIT, GATE DRIVING CIRCUIT AND DISPLAY PANEL", filed on Mar. 23, 2021, the entire contents of which are hereby incorporated by reference as a part of the present application.

TECHNICAL FIELD

The present disclosure relates to the field of display technologies, and in particular, to a shift register unit, a gate driving circuit, and a display panel.

BACKGROUND

In the related art, in order to reduce leakage currents of driving transistors in a light-emitting stage, pixel driving circuits can be formed using Low Temperature Polycrystalline Oxide (LTPO) technologies.

Correspondingly, gate driving circuits need to provide the pixel driving circuits with shift signals whose active levels are low levels and shift signals whose active levels are high levels. In the related art, display panels are typically provided with two groups of gate driving circuits to provide the above two gate driving signals, respectively.

It should be noted that the information disclosed in the Background section above is only for enhancing the understanding of the background of the present disclosure, and thus may include information that does not constitute prior art known to those of ordinary skill in the art.

SUMMARY

According to an aspect of the present disclosure, there is provided a shift register unit, wherein the shift register unit includes a first shift register circuit and a second shift register circuit, the first shift register circuit is coupled to a signal terminal group and a first output terminal, and is configured to output a first shift signal to the first output terminal in response to a signal of the signal terminal group; the second shift register circuit is coupled with the first shift register circuit, the second shift register circuit is coupled to the signal terminal group and a second output terminal, and is configured to output a second shift signal to the second output terminal in response to the signal of the signal terminal group; wherein an active level of the first shift signal and an active level of the second shift signal are logically opposite.

According to an aspect of the present disclosure, there is provided a gate driving circuit, including: the shift register unit described above.

According to an aspect of the present disclosure, there is provided a display panel, including: a pixel driving circuit and the gate driving circuit described above. The pixel driving circuit includes a P-type driving transistor, a N-type switching transistor and a P-type switching transistor, a first electrode of the N-type switching transistor is coupled to a gate of the driving transistor, and a first electrode of the P-type switching transistor is coupled to a first electrode of the driving transistor. The first output terminal of the shift register unit in the gate driving circuit is configured to provide a gate driving signal to the P-type switching transistor, and the second output terminal of the shift register unit in the gate driving circuit is configured to provide the gate driving signal to the N-type switching transistor.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

DETAILED DESCRIPTION

Figures 1, 2:
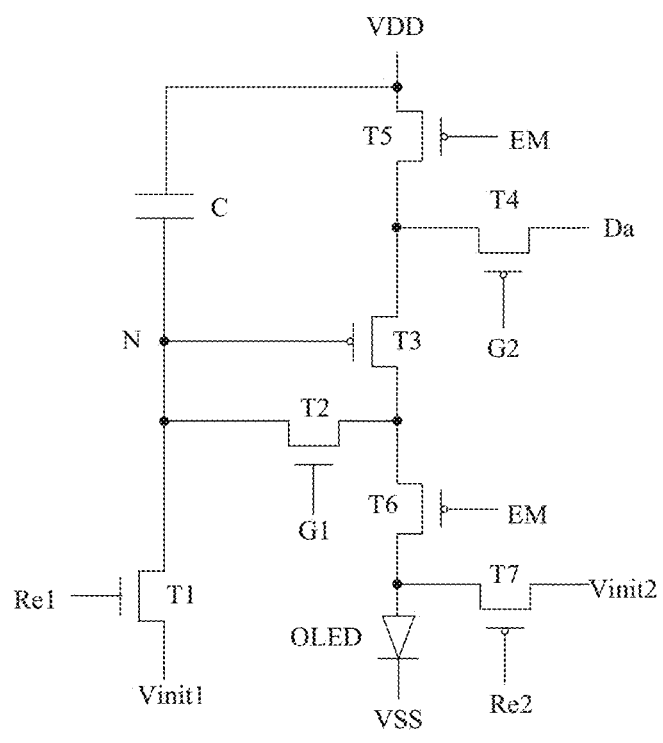
FIG. 1 is a schematic diagram of a circuit structure of a pixel driving circuit in the related art.
FIG. 2 is a timing diagram of each node in a driving method for the pixel driving circuit of FIG. 1.

Embodiments will now be described more fully with reference to the drawings. However, the embodiments can be implemented in a variety of forms and should not be construed as being limited to examples set forth herein; rather, these embodiments are provided so that the present disclosure will be more complete and full so as to convey the idea of the embodiments to those skilled in this art. The same reference numerals in the drawings denote the same or similar structures, and the repeated description thereof will be omitted.

The terms "one", "a" and "the" are used to indicate that there are one or more elements/components or the like; and the terms "include" and "have" are used to indicate an open meaning of including and means that there can be additional elements/components/etc. in addition to the listed elements/components/etc.

FIG. 1 is a schematic diagram of a circuit structure of a pixel driving circuit in the related art, and as shown in FIG. 1, the pixel driving circuit may include a driving transistor T3, a first transistor T1, a second transistor T2, a fourth transistor T4, a fifth transistor T5, a sixth transistor T6, a seventh transistor T7 and a capacitor C. A first electrode of the fourth transistor T4 is coupled to a data signal terminal Da, a second electrode of the fourth transistor T4 is coupled to a first electrode of the driving transistor T3, and a gate of the fourth transistor T4 is coupled to a second gate driving signal terminal G2. A first electrode of the fifth transistor T5 is coupled to a first power terminal VDD, a second electrode of the fifth transistor T5 is coupled to the first electrode of the driving transistor T3, and a gate of the fifth transistor T5 is coupled to an enable signal terminal E M. A gate of the driving transistor T3 is coupled to a node N. A first electrode of the second transistor T2 is coupled to the node N, a second electrode of the second transistor T2 is coupled to a second electrode of the driving transistor T3, and a gate of the second transistor T2 is coupled to a first gate driving signal terminal G1. A first electrode of the sixth transistor T6 is coupled to the second electrode of the driving transistor T3, a second electrode of the sixth transistor T6 is coupled to a first electrode of the seventh transistor T7, and a gate of the sixth transistor T6 is coupled to the enable signal terminal E M. A second electrode of the seventh transistor T7 is coupled to a second initial signal terminal Vinit2, and a gate of the seventh transistor T7 is coupled to a second reset signal terminal Re2. A first electrode of the first transistor T1 is coupled to the node N, a second electrode of the first transistor T1 is coupled to a first initial signal terminal Vinit1, and a gate of the first transistor T1 is coupled to a first reset signal terminal Re1. The capacitor C is coupled between the first power terminal VDD and the node N. The pixel driving circuit can be coupled to a light-emitting unit OLED for driving the light-emitting unit OLED to emit light. The light-emitting unit OLED can be coupled between the second electrode of the sixth transistor T6 and a second power terminal VSS. The first transistor T1 and the second transistor T2 can be N-type metal oxide transistors, which have a relatively small leakage current, so that the electric leakage of the node N through the first transistor T1 and the second transistor T2 in a light-emitting stage can be avoided. Meanwhile, the driving transistor T3, the fourth transistor T4, the fifth transistor T5, the sixth transistor T6 and the seventh transistor T7 can be low-temperature polycrystalline silicon transistors, which have a relatively high carrier mobility, so as to facilitate to achieve a display panel with high resolution, high response speed, high pixel density and high aperture ratio.

FIG. 2 is a timing diagram of each node in a driving method for the pixel driving circuit of FIG. 1, and as shown in FIG. 2, G1 represents a timing of the first gate driving signal terminal G1, G2 represents a timing of the second gate driving signal terminal G2. Re1 represents a timing of the first reset signal terminal Re1, Re2 represents a timing of the second reset signal terminal Re2, EM represents a timing of the enable signal terminal EM, and Da represents a timing of the data signal terminal Da. The driving method for the pixel driving circuit may include a reset stage t1, a compensation stage t2 and a light-emitting stage t3. In the reset phase t1, the first reset signal terminal Re1 outputs a high level signal, the first transistor T1 is turned on, and the first initial signal terminal Vinit1 inputs an initialization signal to the node N. In the compensation stage t2, the first gate driving signal terminal G1 outputs a high-level signal, the second gate driving signal terminal G2 outputs a low-level signal, the second reset signal terminal Re2 outputs the low-level signal, the second transistor T2, the fourth transistor T4 and the seventh transistor T7 are turned on, and the data signal terminal Da outputs a driving signal to write a voltage Vdata+Vth to the node N, where Vdata is a voltage of the driving signal, and Vth is a threshold voltage of the driving transistor T3, and the second initial signal terminal Vinit2 inputs the initialization signal to the second electrode of the sixth transistor T6 at the same time. In the light-emitting stage t3, the enable signal terminal EM outputs the low-level signal, the sixth transistor T6 and the fifth transistor T5 are turned on, and the driving transistor T3 emits the light under the action of the voltage Vdata+Vth stored in the capacitor C. According to an output current formula of the driving transistor $I=(\mu WCox/2L(Vgs-Vth)^2$, where p is a carrier mobility, Cox is a gate capacitance per unit area. W is a width of a channel of the driving transistor, L is a length of the channel of the driving transistor, Vgs is a gate-source voltage difference of the driving transistor, and Vth is the threshold voltage of the driving transistor, an output current of the driving transistor in the pixel driving circuit of the present disclosure is $I=(\mu WCox/2L)(Vdata+Vth-Vdd-Vth)^2$, and in this pixel driving circuit, an influence of the threshold of the driving transistor on its output current can be avoided.

Figure 3:
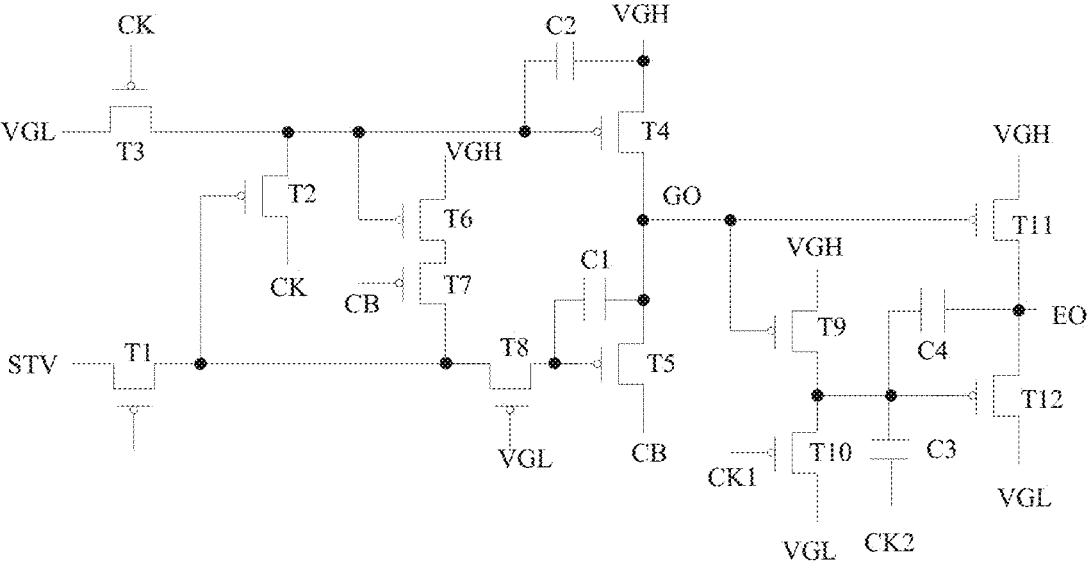
FIG. 3 is a schematic structural diagram of a gate driving circuit in the related art.
Figure 4:
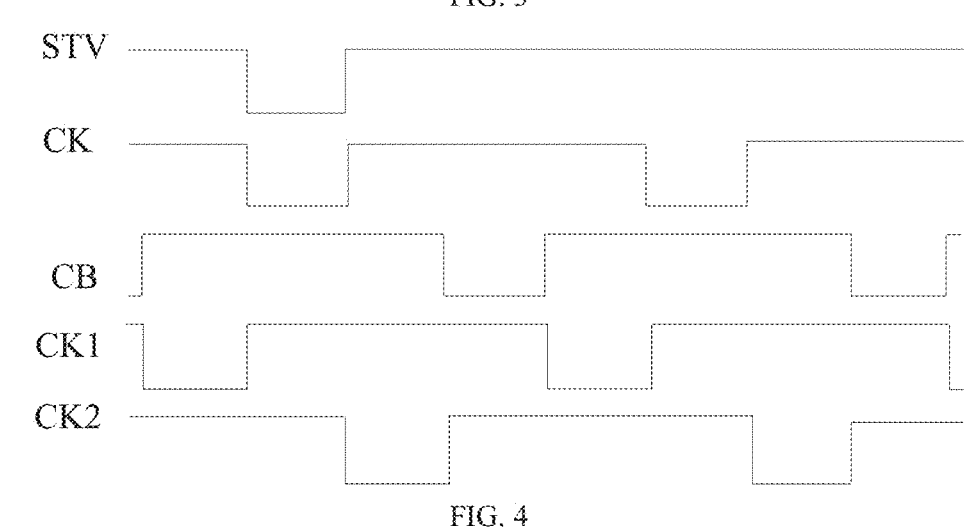
FIG. 4 is a timing diagram of each node in FIG. 3.
Figure 5:
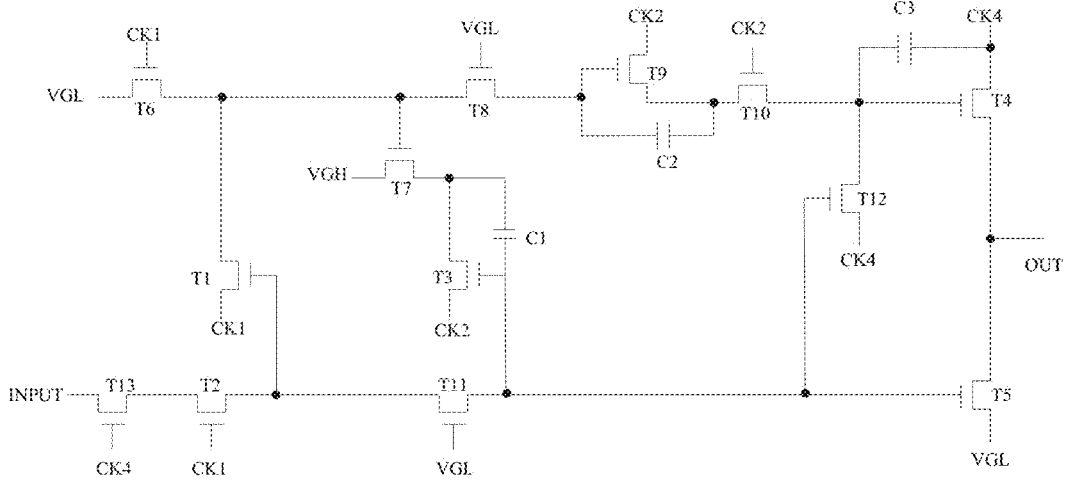
FIG. 5 is a schematic structural diagram of a gate driving circuit in the related art.
Figure 6:
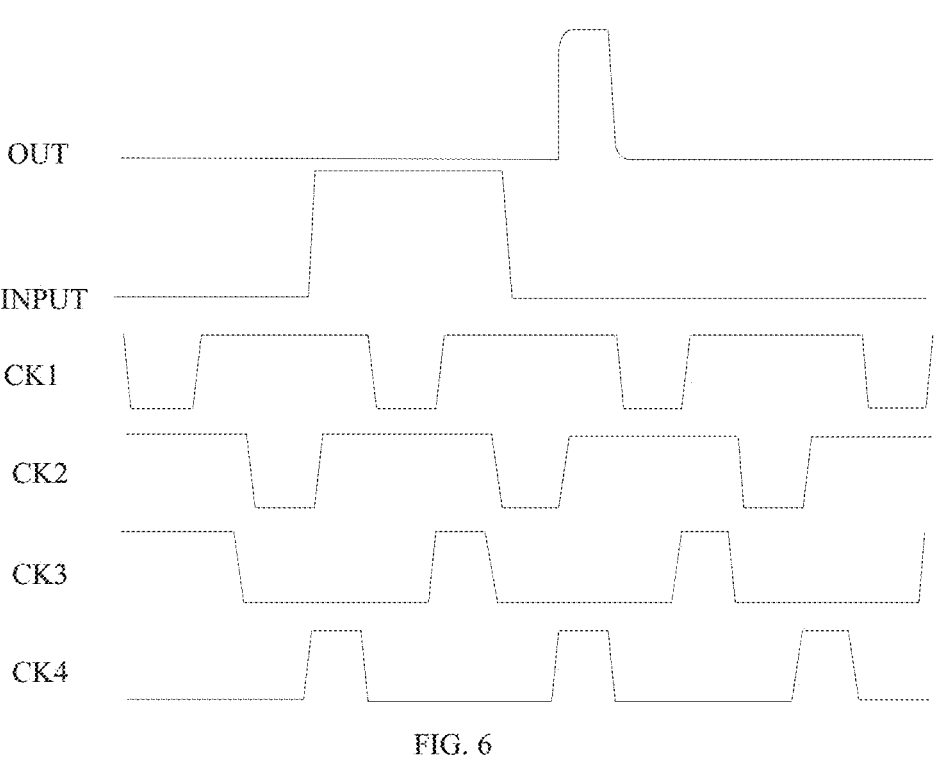
FIG. 6 is a timing diagram of each node in FIG. 5.

It can be seen from FIG. 2 that the first gate driving signal terminal G1 and the second gate driving signal terminal G2 in the pixel driving circuit need to receive two driving signals with opposite levels, respectively, and the first reset signal terminal Re1 and the second reset signal terminal Re2 need to receive two driving signals with opposite levels, respectively. As shown in FIGS. 3-6, FIG. 3 is a schematic structural diagram of a gate driving circuit in the related art, FIG. 4 is a timing diagram of each node in FIG. 3, FIG. 5 is a schematic structural diagram of a gate driving circuit in the related art, and FIG. 6 is a timing diagram of each node in FIG. 5, where CK3 in FIG. 6 provides a signal to a CK4 terminal of the next-stage shift register unit. In FIG. 3, the gate driving circuit includes twelve switching transistors T1-T12, four capacitors C1-C4 and four clock signal terminals CK, CK1, CK2, CB, and the gate driving circuit can provide driving signals to the first gate driving signal terminal G1 and the first reset signal terminal Re1 in the pixel driving circuit shown in FIG. 1. In FIG. 5, the gate driving circuit includes thirteen switching transistors T1-T13, three capacitors C1-C3 and three clock signal terminals CK1, CK2, and CK4, and the gate driving circuit can provide the driving signals to the first gate driving signal terminal G1 and the first reset signal terminal Re1 in the pixel driving circuit shown in FIG. 1. However, as shown in FIGS. 3 and 5, the above two gate driving circuits have a relatively large number of clock signal terminals, and accordingly, a relatively large number of clock signal lines are required to provide clock signals to them. In addition, the display panel is typically provided with two groups of gate driving circuits to respectively provide the above two driving signals with opposite levels, and the two groups of gate driving circuits need to respectively provided with a group of clock signal lines to realize their normal driving. Thus, in the related art, the display panel needs to be provided with a relatively large number of clock signal lines in a non-display area, and a relatively large number of clock signal lines will increase a frame width of the display panel.

Figure 7:
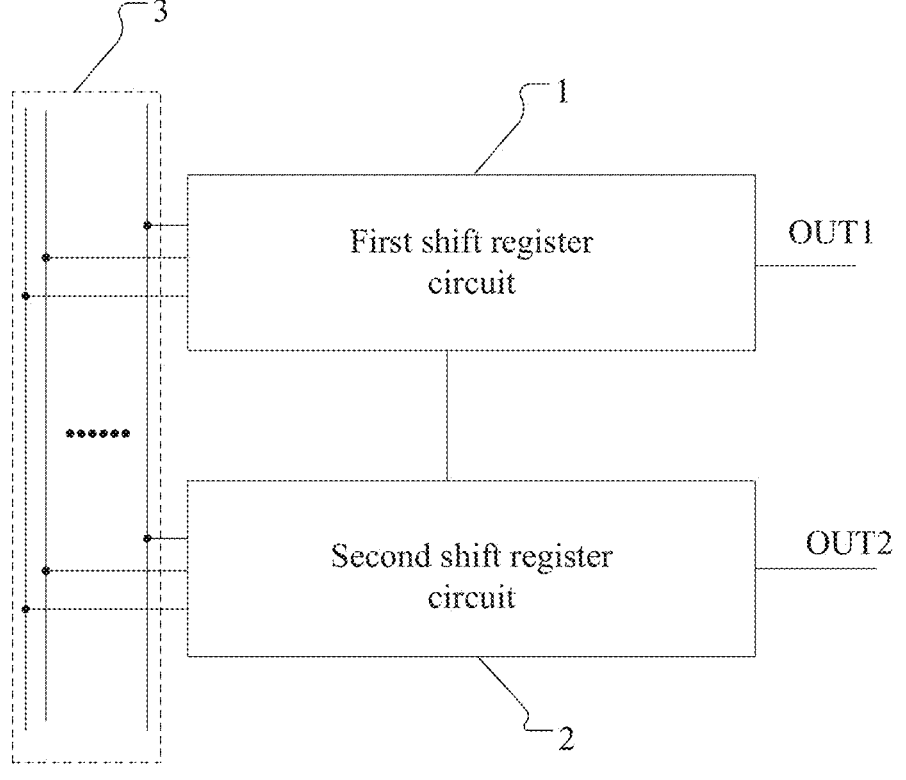
FIG. 7 is a schematic structural diagram of an embodiment of a shift register unit of the present disclosure.

In view of this, embodiments of the present disclosure provide a shift register unit. FIG. 7 is a schematic structural diagram of an embodiment of a shift register unit of the present disclosure, and as shown in FIG. 7, the shift register unit may include a first shift register circuit 1 and a second shift register circuit 2. The first shift register circuit 1 can be coupled to a signal terminal group 3 and a first output terminal OUT1, and is configured to output a first shift signal to the first output terminal OUT1 in response to a signal of the signal terminal group 3. The second shift register circuit 2 can be coupled with the first shift register circuit 1, and the second shift register circuit 2 is coupled to the signal terminal group 3 and a second output terminal OUT2, and is configured to output a second shift signal to the second output terminal OUT2 in response to the signal of the signal terminal group 3. An active level of the first shift signal and an active level of the second shift signal are logically opposite, and the signal terminal group 3 may include at least one signal terminal.

In the embodiments of the present disclosure, the first output terminal can be configured to provide the gate driving signal to the P-type transistor in FIG. 1, and the second output terminal can be configured to provide the gate driving signal to the N-type transistor in FIG. 1. The shift register unit can not only output two driving signals with opposite levels, but also reduce the number of signal lines in the non-display area of the display panel by the first shift register circuit and the second shift register circuit sharing the signal terminal group to achieve a relatively small frame of the display panel.

Figure 8:
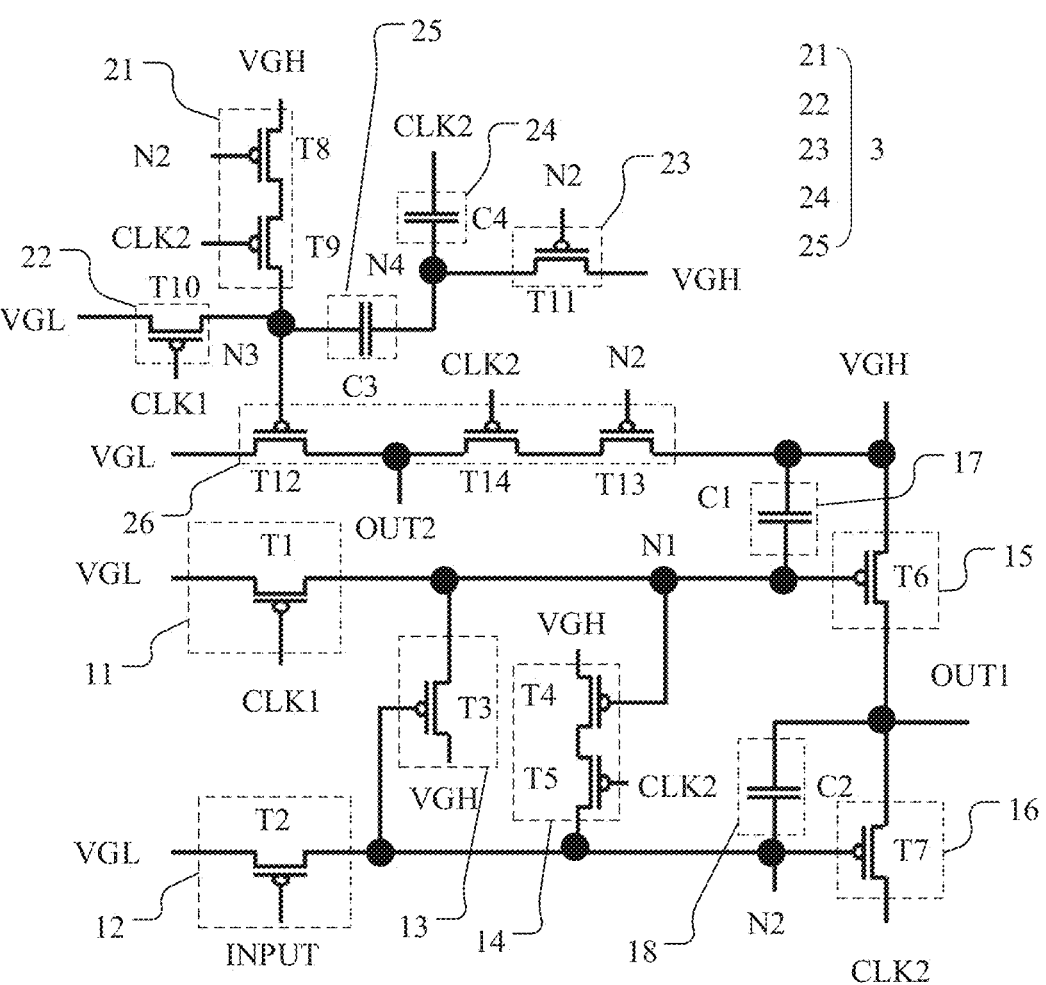
FIG. 8 is a schematic structural diagram of an embodiment of a shift register unit of the present disclosure.

FIG. 8 is a schematic structural diagram of an embodiment of a shift register unit of the present disclosure, and as shown in FIG. 8, the first shift register circuit may include a second node N2, the signal terminal group may include at least one clock signal terminal (e.g., the signal terminal group may include a first clock signal terminal CLK1 and a second clock signal terminal CLK2), and the second shift register circuit may include a control circuit 3 and a third output circuit 26. The control circuit 3 can be coupled to the second node N2, the at least one clock signal terminal and a third node N3, and can be configured to input a control signal to the third node N3 in response to signals of the second node N2 and the at least one clock signal terminal. The third output circuit 26 can be coupled to the third node N3, the at least one clock signal terminal and the second output terminal OUT2, and can be configured to input the second shift signal to the second output terminal OUT2 in response to signals of the third node N3 and the at least one clock signal terminal. The number of clock signal terminals coupled to the control circuit and the number of clock signal terminals coupled to the third output circuit can be the same or different, and the control circuit and the third output circuit can be coupled to different clock signal terminals or the same clock signal terminal. It should be noted that the first shift register circuit including the second node N2 can be understood that the second node N2 is a signal output node in the first shift register circuit.

The at least one clock signal terminal may include the first clock signal terminal CLK1 and the second clock signal terminal CLK2, and the signal terminal group may further include an input signal terminal INPUT, a first power terminal VGL and a second power terminal VGH. The first shift register circuit may include a first input circuit 11, a second input circuit 12, a first control circuit 13, a second control circuit 14, a first output circuit 15, a second output circuit 16, a first storage circuit 17 and a second storage circuit 18. The first input circuit 11 can be coupled to the first power terminal VGL, the first clock signal terminal CLK1 and a first node N1, and can be configured to transmit a signal of the first power terminal VGL to the first node N1 in response to a signal of the first clock signal terminal CLK1. The second input circuit 12 can be coupled to the first power terminal VGL, the input signal terminal INPUT and the second node N2, and can be configured to transmit the signal of the first power terminal VGL to the second node N2 in response to a signal of the input signal terminal INPUT. The first control circuit 13 can be coupled to the first node N1, the second node N2 and the second power terminal VGH, and can be configured to transmit a signal of the second power terminal VGH to the first node N1 in response to a signal of the second node N2. The second control circuit 14 can be coupled to the first node N1, the second node N2, the second power terminal VGH and the second clock signal terminal CLK2, and can be configured to transmit the signal of the second power terminal VGH to the second node N2 in response to signals of the first node N1 and the second clock signal terminal CLK2. The first output circuit 15 can be coupled to the second power terminal VGH, the first output terminal OUT1 and the first node N1, and can be configured to transmit the signal of the second power terminal VGH to the first output terminal OUT1 in response to the signal of the first node N1. The second output circuit 16 can be coupled to the second clock signal terminal CLK2, the second node N2 and the first output terminal OUT1, and can be configured to transmit a signal of the second clock signal terminal CLK2 to the first output terminal OUT1 in response to a signal of the second node N2. The first storage circuit 17 can be coupled to the first node N1. The second storage circuit 18 can be coupled to the second node N2.

It should be noted that, in other embodiments of the present disclosure, the first control circuit 13 may also be coupled to the first node N1, the second node N2 and the first clock signal terminal CLK1, and can be configured to transmit the signal of the first clock signal terminal CLK1 to the first node N1 in response to the signal of the second node N2.

In the embodiments of the present disclosure, as shown in FIG. 8, the first input circuit 11 may include a first transistor T1, a first electrode of the first transistor T1 is coupled to the first power terminal VGL, a second electrode of the first transistor T1 is coupled to the first node N1, and a gate of the first transistor T1 is coupled to the first clock signal terminal CLK1. The second input circuit 12 may include a second transistor T2, a first electrode of the second transistor T2 is coupled to the first power terminal VGL, a second electrode of the second transistor T2 is coupled to the second node N2, and a gate of the second transistor T2 is coupled to the input signal terminal INPUT. The first control circuit 13 may include a third transistor T3, a first electrode of the third transistor T3 is coupled to the second power terminal VGH, a second electrode of the third transistor T3 is coupled to the first node N1, and a gate of the third transistor T3 is coupled to the second node N2. The second control circuit 14 may include a fourth transistor T4 and a fifth transistor T5, a first electrode of the fourth transistor T4 is coupled to the second power terminal VGH, and a gate of the fourth transistor T4 is coupled to the first node N1, and a first electrode of the fifth transistor T5 is coupled to a second electrode of the fourth transistor T4, a second electrode of the fifth transistor T5 is coupled to the second node N2, and a gate of the fifth transistor T5 is coupled to the second clock signal terminal. The first output circuit 15 may include a sixth transistor T6, a first electrode of the sixth transistor T6 is coupled to the second power terminal VGH, a second electrode of the sixth transistor T6 is coupled to the first output terminal OUT1, and a gate of the sixth transistor T6 is coupled to the first node N1. The second output circuit 16 may include a seventh transistor T7, a first electrode of the seventh transistor T7 is coupled to the second clock signal terminal CLK2, a second electrode of the seventh transistor T7 is coupled to the first output terminal OUT1, and a gate of the seventh transistor T7 is coupled to the second node N2. The first storage circuit 17 may include a first capacitor C1 coupled between the second power terminal VGH and the first node N1. The second storage circuit 18 may include a second capacitor C2 coupled between the second node N2 and the first output terminal OUT1.

In the embodiments of the present disclosure, as shown in FIG. 8, the control circuit 3 may include a third input circuit 21, a fourth input circuit 22, a third storage circuit 25, a first coupling circuit 24 and a third control circuit 23. The third input circuit 21 can be coupled to the second power terminal VGH, the second node N2, the second clock signal terminal CLK2 and the third node N3, and can be configured to transmit the signal of the second power terminal VGH to the third node N3 in response to signals of the second node N2 and the second clock signal terminal CLK2. The fourth input circuit 22 can be coupled to the first power terminal VGL, the first clock signal terminal CLK1 and the third node N3, and can be configured to transmit the signal of the first power terminal VGL to the third node N3 in response to the signal of the first clock signal terminal CLK1. The third storage circuit 25 can be coupled between the third node N3 and a fourth node N4. The first coupling circuit 24 can be coupled between the fourth node N4 and the second clock signal terminal CLK2. The third control circuit 23 can be coupled to the fourth node N4, the second node N2 and the second power terminal VGH, and can be configured to transmit the signal of the second power terminal VGH to the fourth node N4 in response to the signal of the second node N2. The third output circuit 26 can be coupled to the first power terminal VGL, the second output terminal OUT2, the third node N3, the second power terminal VGH, the second node N2 and the second clock signal terminal CLK2, and can be configured to transmit the signal of the first power terminal VGL to the second output terminal OUT2 in response to a signal of the third node N3, or transmit the signal of the second power terminal VGH to the second output terminal OUT2 in response to the signals of the second node N2 and the second clock signal terminal CLK2.

In the embodiments of the present disclosure, the third input circuit 21 may include an eighth transistor T8 and a ninth transistor T9, a first electrode of the eighth transistor T8 is coupled to the second power terminal VGH, and a gate of the eighth transistor T8 is coupled to the second node N2, a first electrode of the ninth transistor T9 is coupled to a second electrode of the eighth transistor T8, a second electrode of the ninth transistor T9 is coupled to the third node N3, and a gate of the ninth transistor T9 is coupled to the second clock signal terminal CLK2. The fourth input circuit 22 may include a tenth transistor T10, a first electrode of the tenth transistor T10 is coupled to the first power terminal VGL, a second electrode of the tenth transistor T10 is coupled to the third node N3, and a gate of the tenth transistor T10 is coupled to the first clock signal terminal CLK1. The third control circuit 23 may include an eleventh transistor T11, a first electrode of the eleventh transistor T11 is coupled to the second power terminal VGH, a second electrode of the eleventh transistor T11 is coupled to the fourth node N4, and a gate of the eleventh transistor T11 is coupled to the second node N2. The third output circuit 26 may include a twelfth transistor T12, a thirteenth transistor T13 and a fourteenth transistor T14, a first electrode of the twelfth transistor T12 is coupled to the first power terminal VGL, a second electrode of the twelfth transistor T12 is coupled to the second output terminal OUT2, and a gate of the twelfth transistor T12 is coupled to the third node N3, a first electrode of the thirteenth transistor T13 is coupled to the second power terminal VGH, and a gate of the thirteenth transistor T13 is coupled to the second node N2, a first electrode of the fourteenth transistor T14 is coupled to a second electrode of the thirteenth transistor T13, a second electrode of the fourteenth transistor T14 is coupled to the second output terminal OUT2, and a gate of the fourteenth transistor T14 is coupled to the second clock signal terminal CLK2. The third storage circuit 25 may include a third capacitor C3 coupled between the third node N3 and the fourth node N4. The first coupling circuit 24 may include a fourth capacitor C4 coupled between the fourth node N4 and the second clock signal terminal CLK2.

In the embodiments of the present disclosure, the first to fourteenth transistors can be P-type transistors, the first power terminal can be a low-level signal terminal, and the second power terminal can be a high-level signal terminal. It should be understood that, in other embodiments of the present disclosure, the first to fourteenth transistors may also be N-type transistors. The first input circuit 11, the second input circuit 12, the first control circuit 13, the second control circuit 14, the first output circuit 15, the second output circuit 16, the first storage circuit 17, the second storage circuit 18, the third input circuit 21, the fourth input circuit 22, the third storage circuit 25, the first coupling circuit 24, the third control circuit 23 and the third output circuit 26 may also have other structures.

Figure 9:
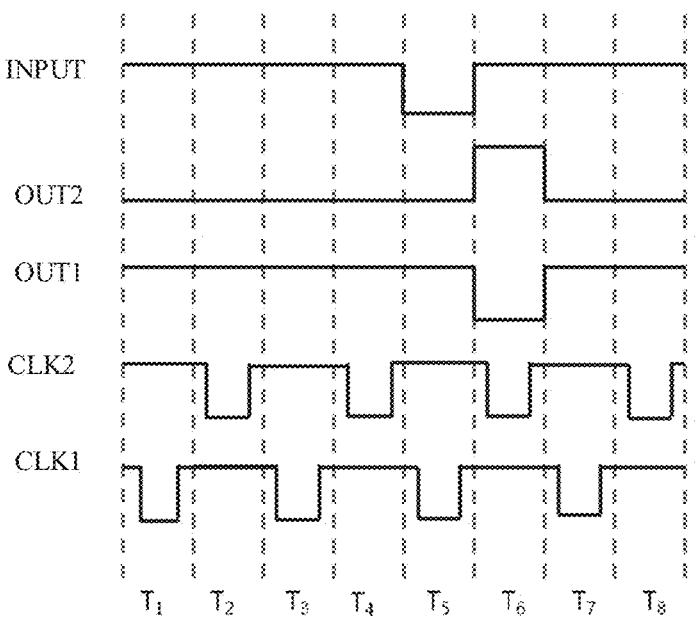
FIG. 9 is a timing diagram of each node in FIG. 8.

FIG. 9 is a timing diagram of each node in FIG. 8, and as shown in FIG. 9, INPUT is a timing of the input signal terminal, OUT1 is a timing of the first output terminal, OUT2 is a timing of the second output terminal, CLK1 is a timing of the first clock signal terminal, and CLK2 is a timing of the second clock signal terminal. The driving method for the shift register unit may include eight stages.

In a first stage T1, the input signal terminal INPUT and the second clock signal terminal output high-level signals, the first clock signal terminal CLK1 outputs the low-level signal, and the second node N2 maintains a high-level state of the previous period. The first power terminal VGL inputs the low-level signal to the first node N1, and the sixth transistor T6 is turned on, the second power terminal VGH inputs the high-level signal to the first output terminal OUT1. Meanwhile, the tenth transistor T10 is turned on, and the first power terminal VGL inputs the low-level signal to the third node N3, the twelfth transistor T12 is turned on, and the first power terminal VGL inputs the low-level signal to the second output terminal OUT2.

In a second stage T2, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 maintains the low-level signal of the previous stage, and the twelfth transistor T12 is turned on, the first power terminal VGL inputs the low-level signal to the second output terminal OUT2.

In a third stage T3, the input signal terminal INPUT and the second clock signal terminal output the high-level signals, the first clock signal terminal CLK1 outputs the low-level signal, and the second node N2 maintains the high-level state of the previous period. The first power terminal VGL inputs the low-level signal to the first node N1, and the sixth transistor T6 is turned on, the second power terminal VGH inputs the high-level signal to the first output terminal OUT1. Meanwhile, the tenth transistor T10 is turned on, and the first power terminal VGL inputs the low-level signal to the third node N3, the twelfth transistor T12 is turned on, and the first power terminal VGL inputs the low-level signal to the second output terminal OUT2.

In a fourth stage T4, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 maintains the low-level signal of the previous stage, and the twelfth transistor T12 is turned on, the first power terminal VGL inputs the low-level signal to the second output terminal OUT2.

In a fifth stage T5, the input signal terminal INPUT and the first clock signal terminal CLK1 output low-level signals, and the second clock signal terminal CLK2 outputs the high-level signal. The first transistor T1 and the second transistor T2 are turned on, and the first power terminal VGL inputs the low-level signal to the second node N2 and the first node N1, the second clock signal terminal CLK2 and the second power terminal VGH simultaneously input the high-level signals to the first output terminal OUT1. Meanwhile, the tenth transistor T10 is turned on, and the first power terminal inputs the low-level signal to the third node, the twelfth transistor is turned on, and the first power terminal inputs the low-level signal to the second output terminal.

In a sixth stage, the input signal terminal INPUT and the first clock signal terminal output the high-level signals, the second clock signal terminal outputs the low-level signal, and the second node maintains the low-level signal of the previous stage. The third transistor is turned on, and the second power terminal inputs the high-level signal to the first node to turn off the sixth transistor. The seventh transistor is turned on, and the second clock signal terminal inputs the low-level signal to the first output terminal. Meanwhile, the eighth transistor and the ninth transistor are turned on, and the second power terminal inputs the high-level signal to the third node to turn off the twelfth transistor. The thirteenth transistor and the fourteenth transistor are turned on, and the second power terminal inputs the high-level signal to the second output terminal.

In a seventh stage, the input signal terminal INPUT and the second clock signal terminal output the high-level signals, the first clock signal terminal outputs the low-level signal, and the second node maintains the low-level signal of the previous stage. The first transistor is turned on, and the first power terminal inputs the low-level signal to the first node, the sixth transistor is turned on, and the second power terminal inputs the high-level signal to the first output terminal. Meanwhile, the tenth transistor is turned on, and the first power terminal inputs the low-level signal to the third node, the twelfth transistor T12 is turned on, and the first power terminal inputs the low-level signal to the second output terminal.

In an eighth stage, the input signal terminal and the first clock signal terminal output the high-level signals, the second clock signal terminal outputs the low-level signal, and the first node maintains the low-level signal of the previous stage. The fourth transistor, the fifth transistor and the sixth transistor are turned on, and the second power terminal inputs the high-level signal to the second node and the first output terminal. Meanwhile, the third node maintains the low-level signal of the previous stage, and the second output terminal outputs the low-level signal.

In the fifth stage, the sixth stage and the seventh stage, the eleventh transistor T11 is turned on, and the second power terminal inputs a stable voltage to the fourth node to avoid voltage fluctuation of the second clock signal terminal CLK2 affecting a voltage of the third node N3 under the coupling effect of the capacitors C3 and C4, so that the voltage fluctuation of the second output terminal due to the voltage fluctuation of the third node is avoided. In addition, in the eighth stage, the second node outputs the high-level signal, and the eleventh transistor is turned off, and the signal of the second clock signal terminal changes from the high level to the low level, and the voltage of the third node will be reduced under the coupling effect of the capacitors C3 and C4, so that the second output terminal outputs a sufficiently low low-level signal.

Figure 10:
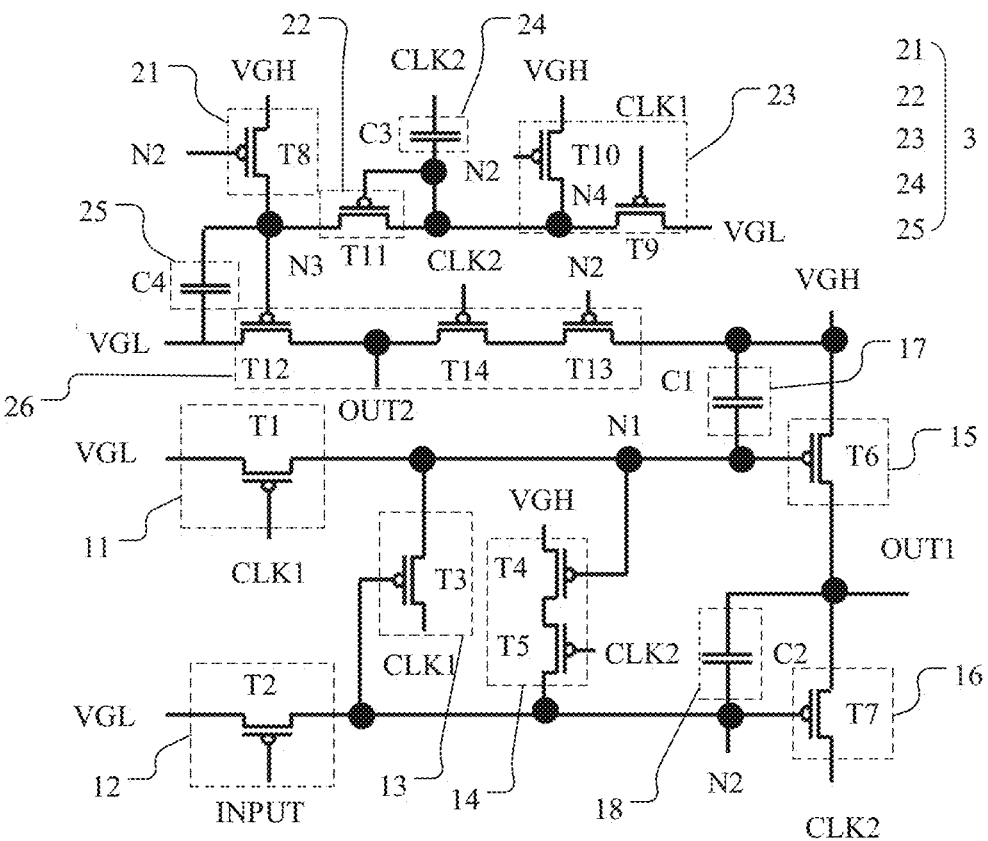
FIG. 10 is a schematic structural diagram of another embodiment of a shift register unit of the present disclosure.

FIG. 10 is a schematic structural diagram of another embodiment of a shift register unit of the present disclosure, and as shown in FIG. 10, the first shift register circuit may include a second node N2, the signal terminal group may include at least one clock signal terminal (e.g., the signal terminal group may include a first clock signal terminal CLK1 and a second clock signal terminal CLK2), and the second shift register circuit may include a control circuit 3 and a third output circuit 26. The control circuit 3 can be coupled to the second node N2, the at least one clock signal terminal and a third node N3, and can be configured to input a control signal to the third node N3 in response to signals of the second node N2 and the at least one clock signal terminal. The third output circuit 26 can be coupled to the third node N3, the at least one clock signal terminal and the second output terminal OUT2, and can be configured to input the second shift signal to the second output terminal OUT2 in response to signals of the third node N3 and the at least one clock signal terminal. The number of clock signal terminals coupled to the control circuit and the number of clock signal terminals coupled to the third output circuit can be the same or different, and the control circuit and the third output circuit can be coupled to different clock signal terminals or the same clock signal terminal.

The at least one clock signal terminal may include the first clock signal terminal CLK1 and the second clock signal terminal CLK2, and the signal terminal group may further include an input signal terminal INPUT, a first power terminal VGL and a second power terminal VGH. The first shift register circuit may include a first input circuit 11, a second input circuit 12, a first control circuit 13, a second control circuit 14, a first output circuit 15, a second output circuit 16, a first storage circuit 17 and a second storage circuit 18. The first input circuit 11 can be coupled to the first power terminal VGL, the first clock signal terminal CLK1 and a first node N1, and can be configured to transmit a signal of the first power terminal VGL to the first node N1 in response to a signal of the first clock signal terminal CLK1. The second input circuit 12 can be coupled to the first power terminal VGL, the input signal terminal INPUT and the second node N2, and can be configured to transmit the signal of the first power terminal VGL to the second node N2 in response to a signal of the input signal terminal INPUT. The first control circuit 13 can be coupled to the first node N1, the second node N2 and the first clock signal terminal CLK1, and can be configured to transmit the signal of the first clock signal terminal CLK1 to the first node N1 in response to a signal of the second node N2. The second control circuit 14 can be coupled to the first node N1, the second node N2, the second power terminal VGH and the second clock signal terminal CLK2, and can be configured to transmit the signal of the second power terminal VGH to the second node N2 in response to signals of the first node N1 and the second clock signal terminal CLK2. The first output circuit 15 can be coupled to the second power terminal VGH, the first output terminal OUT1 and the first node N1, and can be configured to transmit the signal of the second power terminal VGH to the first output terminal OUT1 in response to the signal of the first node N1. The second output circuit 16 can be coupled to the second clock signal terminal CLK2, the second node N2 and the first output terminal OUT1, and can be configured to transmit a signal of the second clock signal terminal CLK2 to the first output terminal OUT1 in response to a signal of the second node N2. The first storage circuit 17 can be coupled to the first node N1. The second storage circuit 18 can be coupled to the second node N2.

It should be noted that, in other embodiments of the present disclosure, the first control circuit 13 may also be coupled to the first node N1, the second node N2 and the second power terminal, and can be configured to transmit the signal of the second power terminal to the first node N1 in response to the signal of the second node N2.

In the embodiments of the present disclosure, as shown in FIG. 10, the first input circuit 11 may include a first transistor T1, a first electrode of the first transistor T1 is coupled to the first power terminal VGL, a second electrode of the first transistor T1 is coupled to the first node N1, and a gate of the first transistor T1 is coupled to the first clock signal terminal CLK1. The second input circuit 12 may include a second transistor T2, a first electrode of the second transistor T2 is coupled to the first power terminal VGL, a second electrode of the second transistor T2 is coupled to the second node N2, and a gate of the second transistor T2 is coupled to the input signal terminal INPUT. The first control circuit 13 may include a third transistor T3, a first electrode of the third transistor T3 is coupled to the second power terminal VGH, a second electrode of the third transistor T3 is coupled to the first node N1, and a gate of the third transistor T3 is coupled to the second node N2. The second control circuit 14 may include a fourth transistor T4 and a fifth transistor T5, a first electrode of the fourth transistor T4 is coupled to the second power terminal VGH, and a gate of the fourth transistor T4 is coupled to the first node N1, and a first electrode of the fifth transistor T5 is coupled to a second electrode of the fourth transistor T4, a second electrode of the fifth transistor T5 is coupled to the second node N2, and a gate of the fifth transistor T5 is coupled to the second clock signal terminal. The first output circuit 15 may include a sixth transistor T6, a first electrode of the sixth transistor T6 is coupled to the second power terminal VGH, a second electrode of the sixth transistor T6 is coupled to the first output terminal OUT1, and a gate of the sixth transistor T6 is coupled to the first node N1. The second output circuit 16 may include a seventh transistor T7, a first electrode of the seventh transistor T7 is coupled to the second clock signal terminal CLK2, a second electrode of the seventh transistor T7 is coupled to the first output terminal OUT1, and a gate of the seventh transistor T7 is coupled to the second node N2. The first storage circuit 17 may include a first capacitor C1 coupled between the second power terminal VGH and the first node N1. The second storage circuit 18 may include a second capacitor C2 coupled between the second node N2 and the first output terminal OUT1.

In the embodiments of the present disclosure, as shown in FIG. 10, the control circuit 3 may include a third input circuit 21, a third control circuit 23, a first coupling circuit 24, a fourth input circuit 22 and a third storage circuit 25. The third input circuit 21 can be coupled to the second power terminal VGH, the second node N2 and the third node N3, and can be configured to transmit the signal of the second power terminal VGH to the third node N3 in response to the signal of the second node N2. The third control circuit 23 can be coupled to the first power terminal VGL, the second node N2, the second power terminal VGH, the first clock signal terminal CLK1 and a fourth node N4, and can be configured to transmit the signal of the first power terminal VGL to the fourth node N4 in response to the signal of the first clock signal terminal CLK1, and transmit the signal of the second power terminal VGH to the fourth node N4 in response to the signal of the second node N2. The first coupling circuit 24 can be coupled between the second clock signal terminal CLK2 and the fourth node N4, and can be configured to couple the signal of the second clock signal terminal CLK2 to the fourth node N4. The fourth input circuit 22 is coupled to the fourth node N4 and the third node N3, and is configured to transmit a signal of the fourth node N4 to the third node N3 in response to the signal of the fourth node N4. The third storage circuit 25 is coupled to the third node N3. The third output circuit 26 is coupled to the first power terminal VGL, the second output terminal OUT2, the third node N3, the second clock signal terminal CLK2, the second node N2 and the second power terminal VGH, and is configured to transmit the signal of the first power terminal VGL to the second output terminal OUT2 in response to a signal of the third node N3, or transmit the signal of the second power terminal VGH to the second output terminal OUT2 in response to signals of the second node N2 and the second clock signal terminal CLK2.

In the embodiments of the present disclosure, as shown in FIG. 10, the third input circuit 21 may include an eighth transistor T8, a first electrode of the eighth transistor T8 is coupled to the second power terminal VGH, a second electrode of the eighth transistor T8 is coupled to the third node N3, and a gate of the eighth transistor T8 is coupled to the second node N2. The third control circuit 23 may include a ninth transistor T9 and a tenth transistor T10, a first electrode of the ninth transistor T9 is coupled to the first power terminal VGL, a second electrode of the ninth transistor T9 is coupled to the fourth node N4, and a gate of the ninth transistor T9 is coupled to the first clock signal terminal CLK1, and a first electrode of the tenth transistor T10 is coupled to the second power terminal VGH, a second electrode of the tenth transistor T10 is coupled to the fourth node N4, and a gate of the tenth transistor T10 is coupled to the second node N2. The first coupling circuit 24 may include a third capacitor C3 coupled between the second clock signal terminal CLK2 and the fourth node N4. The fourth input circuit 22 may include an eleventh transistor T11, a first electrode of the eleventh transistor T11 is coupled to the fourth node N4, a second electrode of the eleventh transistor T11 is coupled to the third node N3, and a gate of the eleventh transistor T11 is coupled to the fourth node N4. The third storage circuit 25 may include a fourth capacitor C4 that can be coupled between the third node N3 and the first power terminal VGL. The third output circuit 26 may include a twelfth transistor T12, a thirteenth transistor T13 and a fourteenth transistor T14, a first electrode of the twelfth transistor T12 is coupled to the first power terminal VGL, a second electrode of the twelfth transistor T12 is coupled to the second output terminal OUT2, and a gate of the twelfth transistor T12 is coupled to the third node N3, a first electrode of the thirteenth transistor T13 is coupled to the second power terminal VGH, and a gate of the thirteenth transistor T13 is coupled to the second node N2, a first electrode of the fourteenth transistor T14 is coupled to a second electrode of the thirteenth transistor T13, a second electrode of the fourteenth transistor T14 is coupled to the second output terminal OUT2, and a gate of the fourteenth transistor T14 is coupled to the second clock signal terminal CLK2.

In the embodiments of the present disclosure, the first to fourteenth transistors can be the P-type transistors, the first power terminal can be the low-level signal terminal, and the second power terminal can be the high-level signal terminal. It should be understood that, in other embodiments of the present disclosure, the first to fourteenth transistors may also be the N-type transistors. The first input circuit 11, the second input circuit 12, the first control circuit 13, the second control circuit 14, the first output circuit 15, the second output circuit 16, the first storage circuit 17, the second storage circuit 18, the third input circuit 21, the third control circuit 23, the first coupling circuit 24, the fourth input circuit 22, the third storage circuit 25 and the third output circuit 26 may have other structures.

Figure 11:
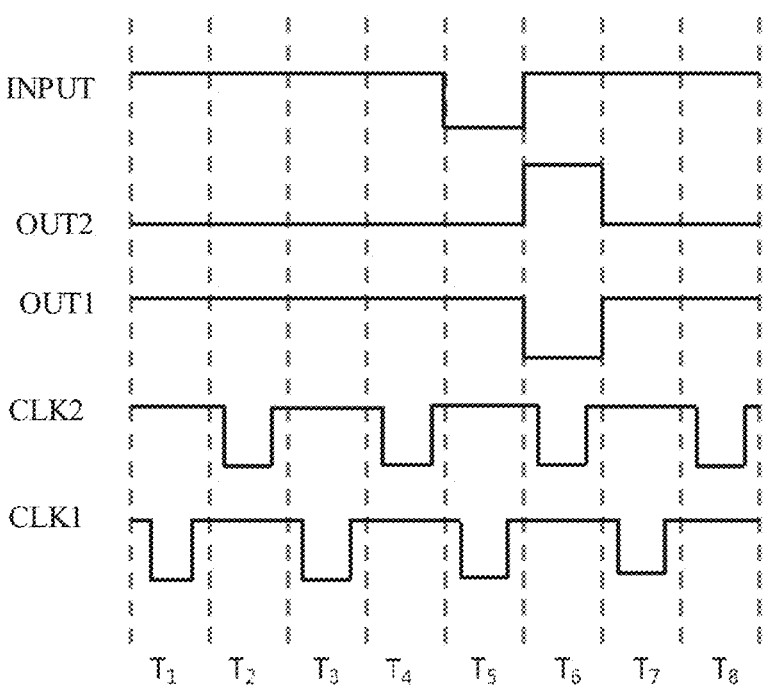
FIG. 11 is a timing diagram of each node in FIG. 10.

FIG. 11 is a timing diagram of each node in FIG. 10, and as shown in FIG. 11. INPUT is a timing of the input signal terminal, OUT1 is a timing of the first output terminal, OUT2 is a timing of the second output terminal. CLK1 is a timing of the first clock signal terminal, and CLK2 is a timing of the second clock signal terminal. The driving method for the shift register unit may include eight stages.

In a first stage T1, the input signal terminal INPUT and the second clock signal terminal output the high-level signals, the first clock signal terminal CLK1 outputs the low-level signal, and the second node N2 maintains the high-level state of the previous period. The first power terminal VGL inputs the low-level signal to the first node N1, and the sixth transistor T6 is turned on, the second power terminal VGH inputs the high-level signal to the first output terminal OUT1. Meanwhile, the ninth transistor T9 is turned on, and the first power terminal VGL inputs the low-level signal to the fourth node N4, the eleventh transistor T11 is turned on, the fourth node inputs the low-level signal to the third node, the twelfth transistor T12 is turned on, and the first power terminal VGL inputs the low-level signal to the second output terminal OUT2.

In a second stage T2, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 maintains the low-level signal of the previous stage, and the twelfth transistor T12 is turned on, the first power terminal VGL inputs the low-level signal to the second output terminal OUT2.

In a third stage T3, the input signal terminal INPUT and the second clock signal terminal output the high-level signals, the first clock signal terminal CLK1 outputs the low-level signal, and the second node N2 maintains the high-level state of the previous period. The first power terminal VGL inputs the low-level signal to the first node N1, and the sixth transistor T6 is turned on, the second power terminal VGH inputs the high-level signal to the first output terminal OUT1. Meanwhile, the ninth transistor T9 is turned on, and the first power terminal VGL inputs the low-level signal to the fourth node N4, the eleventh transistor T11 is turned on, the fourth node inputs the low-level signal to the third node, the twelfth transistor T12 is turned on, and the first power terminal VGL inputs the low-level signal to the second output terminal OUT2.

In a fourth stage T4, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 maintains the low-level signal of the previous stage, and the twelfth transistor T12 is turned on, the first power terminal VGL inputs the low-level signal to the second output terminal OUT2.

In a fifth stage T5, the input signal terminal INPUT and the first clock signal terminal CLK1 output low-level signals, and the second clock signal terminal CLK2 outputs the high-level signal. The first transistor T1 and the second transistor T2 are turned on, and the first power terminal VGL inputs the low-level signal to the second node N2 and the first node N1, the second clock signal terminal CLK2 and the second power terminal VGH simultaneously input the high-level signals to the first output terminal OUT1. Meanwhile, the ninth transistors T9 and the tenth transistor T10 are turned on, and the first power terminal inputs the low-level signal to the fourth node, the second power terminal inputs the high-level signal to the fourth node. In the embodiments of the present disclosure, a driving capability of the first power terminal can be greater than a driving capability of the second power terminal, and in this case, a voltage of the fourth node can be the low-level signal, and the eleventh transistor is turned on, the fourth node inputs the low-level signal to the third node, and the twelfth transistor is turned on, the first power terminal inputs the low-level signal to the second output terminal.

In a sixth stage, the input signal terminal INPUT and the first clock signal terminal output the high-level signals, the second clock signal terminal outputs the low-level signal, and the second node maintains the low-level signal of the previous stage. The third transistor is turned on, and the first clock signal terminal inputs the high-level signal to the first node to turn off the sixth transistor. The seventh transistor is turned on, and the second clock signal terminal inputs the low-level signal to the first output terminal. Meanwhile, the tenth transistor is turned on, and the second power terminal inputs the high-level signal to the fourth node, the eleventh transistor is turned off. The eighth transistor is turned on, and the second power terminal inputs the high-level signal to the third node, the twelfth transistor is turned off. The thirteenth transistor and the fourteenth transistor are turned on, and the second power terminal inputs the high-level signal to the second output terminal.

In a seventh stage, the input signal terminal INPUT and the second clock signal terminal output the high-level signals, the first clock signal terminal outputs the low-level signal, and the second node maintains the low-level signal of the previous stage. The first transistor is turned on, and the first power terminal inputs the low-level signal to the first node, the sixth transistor is turned on, and the second power terminal inputs the high-level signal to the first output terminal. Meanwhile, the ninth transistors T9 and the tenth transistor T10 are turned on, and the first power terminal inputs the low-level signal to the fourth node, the second power terminal inputs the high-level signal to the fourth node. In the embodiments of the present disclosure, a driving capability of the first power terminal can be greater than a driving capability of the second power terminal, and in this case, a voltage of the fourth node can be the low-level signal, and the eleventh transistor is turned on, the fourth node inputs the low-level signal to the third node, and the twelfth transistor is turned on, the first power terminal inputs the low-level signal to the second output terminal.

In an eighth stage, the input signal terminal and the first clock signal terminal output the high-level signals, the second clock signal terminal outputs the low-level signal, and the first node maintains the low-level signal of the previous stage. The fourth transistor, the fifth transistor and the sixth transistor are turned on, and the second power terminal inputs the high-level signal to the second node and the first output terminal. Meanwhile, the third node maintains the low-level signal of the previous stage, and the second output terminal outputs the low-level signal. In the second stage, the fourth stage and the eighth stage, the signal of the second clock signal terminal changes from the high level to the low level, and the voltage of the fourth node will be reduced under the coupling effect of the capacitor C3, so that a degree of conduction of the eleventh transistor can be increased. It should be noted that, in the fifth stage, the short circuit of the first power terminal and the second power terminal in the shift register unit occurs, which may cause circuit damage due to an excessive circuit current.

Figure 12:
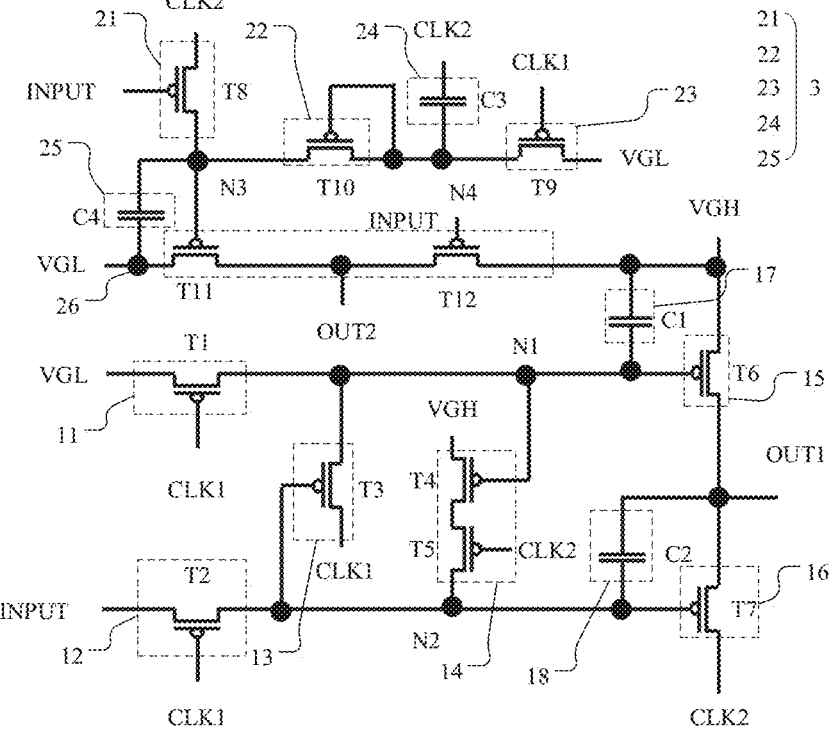
FIG. 12 is a schematic structural diagram of another embodiment of a shift register unit of the present disclosure.

In the embodiments of the present disclosure, FIG. 12 is a schematic structural diagram of another embodiment of a shift register unit of the present disclosure, and as shown in FIG. 12, the signal terminal group may include an input signal terminal INPUT and at least one clock signal terminal (e.g., a first clock signal terminal CLK1 and a second clock signal terminal CLK2), and the second shift register circuit may include a control circuit 3 and a third output circuit 26. The control circuit 3 can be coupled to the input signal terminal INPUT, the at least one clock signal terminal and the third node N3, and can be configured to input a control signal to the third node N3 in response to signals of the input signal terminal INPUT and the at least one clock signal terminal. The third output circuit 26 can be coupled to the third node N3, the input signal terminal INPUT and the second output terminal OUT2, and can be configured to input the second shift signal to the second output terminal OUT2 in response to signals of the third node N3 and the input signal terminal INPUT.

The at least one clock signal terminal may include the first clock signal terminal CLK1 and the second clock signal terminal CLK2, and the signal terminal group may further include a first power terminal VGL and a second power terminal VGH. The first shift register circuit may include a first input circuit 11, a second input circuit 12, a first control circuit 13, a second control circuit 14, a first output circuit 15, a second output circuit 16, a first storage circuit 17 and a second storage circuit 18. The first input circuit 11 can be coupled to the first power terminal VGL, the first clock signal terminal CLK1 and a first node N1, and can be configured to transmit a signal of the first power terminal VGL to the first node N1 in response to a signal of the first clock signal terminal CLK1. The second input circuit 12 can be coupled to the first clock signal terminal CLK1, the input signal terminal INPUT and the second node N2, and can be configured to transmit a signal of the input signal terminal INPUT to the second node N2 in response to the signal of the first clock signal terminal CLK1. The first control circuit 13 can be coupled to the first node N1, the second node N2 and the first clock signal terminal CLK1, and can be configured to transmit a signal of the first clock signal terminal CLK1 to the first node N1 in response to a signal of the second node N2. The second control circuit 14 can be coupled to the first node N1, the second node N2, the second power terminal VGH and the second clock signal terminal CLK2, and can be configured to transmit the signal of the second power terminal VGH to the second node N2 in response to signals of the first node N1 and the second clock signal terminal CLK2. The first output circuit 15 can be coupled to the second power terminal VGH, the first output terminal OUT1 and the first node N1, and can be configured to transmit the signal of the second power terminal VGH to the first output terminal OUT1 in response to the signal of the first node N1. The second output circuit 16 can be coupled to the second clock signal terminal CLK2, the second node N2 and the first output terminal OUT1, and can be configured to transmit a signal of the second clock signal terminal CLK2 to the first output terminal OUT1 in response to a signal of the second node N2. The first storage circuit 17 can be coupled to the first node N1. The second storage circuit 18 can be coupled to the second node N2.

In the embodiments of the present disclosure, as shown in FIG. 12, the first input circuit 11 may include a first transistor T1, a first electrode of the first transistor T1 is coupled to the first power terminal VGL, a second electrode of the first transistor T1 is coupled to the first node N1, and a gate of the first transistor T1 is coupled to the first clock signal terminal CLK1. The second input circuit 12 may include a second transistor T2, a first electrode of the second transistor T2 is coupled to the input signal terminal INPUT, a second electrode of the second transistor T2 is coupled to the second node N2, and a gate of the second transistor T2 is coupled to the first clock signal terminal CLK1. The first control circuit 13 may include a third transistor T3, a first electrode of the third transistor T3 is coupled to the first clock signal terminal CLK1, a second electrode of the third transistor T3 is coupled to the first node N1, and a gate of the third transistor T3 is coupled to the second node N2. The second control circuit 14 may include a fourth transistor T4 and a fifth transistor T5, a first electrode of the fourth transistor T4 is coupled to the second power terminal VGH, and a gate of the fourth transistor T4 is coupled to the first node N1, and a first electrode of the fifth transistor T5 is coupled to a second electrode of the fourth transistor T4, a second electrode of the fifth transistor T5 is coupled to the second node N2, and a gate of the fifth transistor T5 is coupled to the second clock signal terminal CLK2. The first output circuit 15 may include a sixth transistor T6, a first electrode of the sixth transistor T6 is coupled to the second power terminal VGH, a second electrode of the sixth transistor T6 is coupled to the first output terminal OUT1, and a gate of the sixth transistor T6 is coupled to the first node N1. The second output circuit 16 may include a seventh transistor T7, a first electrode of the seventh transistor T7 is coupled to the second clock signal terminal CLK2, a second electrode of the seventh transistor T7 is coupled to the first output terminal OUT1, and a gate of the seventh transistor T7 is coupled to the second node N2. The first storage circuit 17 may include a first capacitor C1 that can be coupled between the second power terminal VGH and the first node N1. The second storage circuit 18 may include a second capacitor C2 that can be coupled between the second node N2 and the first output terminal OUT1.

In the embodiments of the present disclosure, as shown in FIG. 12, the control circuit 3 may include a third input circuit 21, a third control circuit 23, a first coupling circuit 24, a fourth input circuit 22 and a third storage circuit 25. The third input circuit 21 can be coupled to the second clock signal terminal CLK2, the input signal terminal INPUT and the third node N3, and can be configured to transmit the signal of the second clock signal terminal CLK2 to the third node N3 in response to the signal of the input signal terminal INPUT. The third control circuit 23 can be coupled to the first power terminal VGL, the first clock signal terminal CLK1 and the fourth node N4, and can be configured to transmit the signal of the first power terminal VGL to the fourth node N4 in response to the signal of the first clock signal terminal CLK1. The first coupling circuit 24 can be coupled between the second clock signal terminal CLK2 and the fourth node N4, and can be configured to couple the signal of the second clock signal terminal CLK2 to the fourth node N4. The fourth input circuit 22 can be coupled to the fourth node N4 and the third node N3, and can be configured to transmit a signal of the fourth node N4 to the third node N3 in response to the signal of the fourth node N4. The third storage circuit 25 can be coupled to the third node N3. The third output circuit 26 can be coupled to the first power terminal VGL, the third node N3, the second output terminal OUT2, the input signal terminal INPUT and the second power terminal VGH, and can be configured to transmit the signal of the first power terminal VGL to the second output terminal OUT2 in response to a signal of the third node N3, or transmit the signal of the second power terminal VGH to the second output terminal OUT2 in response to the signal of the input signal terminal INPUT.

In the embodiments of the present disclosure, as shown in FIG. 12, the third input circuit 21 may include an eighth transistor T8, a first electrode of the eighth transistor T8 is coupled to the second clock signal terminal CLK2, a second electrode of the eighth transistor T8 is coupled to the third node N3, and a gate of the eighth transistor T8 is coupled to the input signal terminal INPUT. The third control circuit 23 may include a ninth transistor T9, a first electrode of the ninth transistor T9 is coupled to the first power terminal VGL, a second electrode of the ninth transistor T9 is coupled to the fourth node N4, and a gate of the ninth transistor T9 is coupled to the first clock signal terminal CLK1. The first coupling circuit 24 may include a third capacitor C3 coupled between the fourth node N4 and the second clock signal terminal CLK2. The fourth input circuit 22 may include a tenth transistor T10, a first electrode of the tenth transistor T10 is coupled to the fourth node N4, a second electrode of the tenth transistor T10 is coupled to the third node N3, and a gate of the tenth transistor T10 is coupled to the fourth node N4. The third storage circuit 25 may include a fourth capacitor C4 coupled between the third node N3 and the first power terminal VGL. The third output circuit 26 may include an eleventh transistor T11 and a twelfth transistor T12, a first electrode of the eleventh transistor T11 is coupled to the first power terminal VGL, a second electrode of the eleventh transistor T11 is coupled to the second output terminal OUT2, and a gate of the eleventh transistor T11 is coupled to the third node N3, and a first electrode of the twelfth transistor T12 is coupled to the second power terminal VGH, a second electrode of the twelfth transistor T12 is coupled to the second output terminal OUT2, and a gate of the twelfth transistor T12 is coupled to the input signal terminal INPUT.

In the embodiments of the present disclosure, the first to twelfth transistors can be the P-type transistors, the first power terminal can be the low-level signal terminal, and the second power terminal can be the high-level signal terminal. It should be understood that, in other embodiments of the present disclosure, the first to twelfth transistors may also be the N-type transistors. The first input circuit 11, the second input circuit 12, the first control circuit 13, the second control circuit 14, the first output circuit 15, the second output circuit 16, the first storage circuit 17, the second storage circuit 18, the third input circuit 21, the third control circuit 23, the first coupling circuit 24, the fourth input circuit 22, the third storage circuit 25 and the third output circuit 26 may have other structures.

Figure 13:
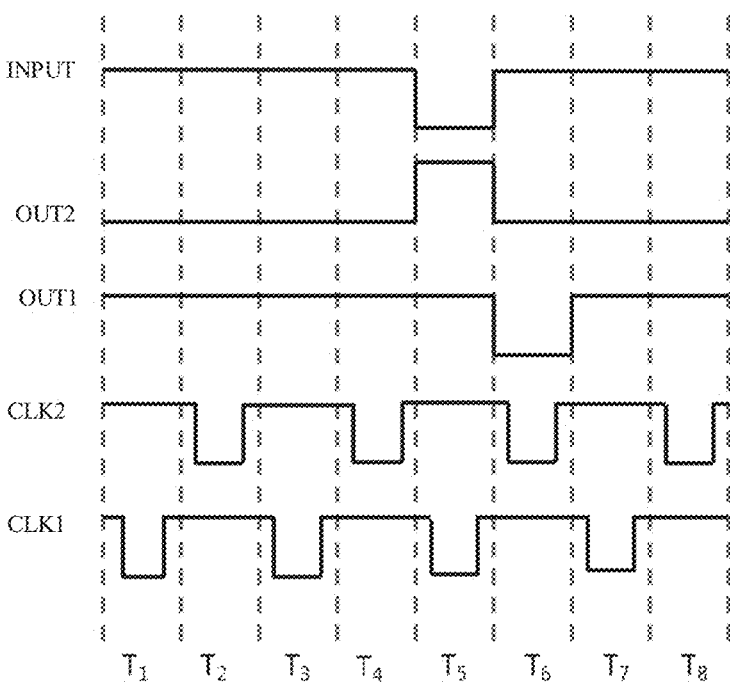
FIG. 13 is a timing diagram of each node in FIG. 12.

FIG. 13 is a timing diagram of each node in FIG. 12, and as shown in FIG. 13, INPUT is a timing of the input signal terminal, OUT1 is a timing of the first output terminal, OUT2 is a timing of the second output terminal, CLK1 is a timing of the first clock signal terminal, and CLK2 is a timing of the second clock signal terminal. The driving method for the shift register unit may include eight stages.

In a first stage T1, the input signal terminal INPUT and the second clock signal terminal output the high-level signals, and the first clock signal terminal CLK1 outputs the low-level signal. The first transistor is turned on, and the first power terminal inputs the low-level signal to the first node. The second transistor is turned on, and the input signal terminal inputs the high-level signal to the second node. The sixth transistor T6 is turned on, and the second power terminal VGH inputs the high-level signal to the first output terminal OUT1. Meanwhile, the ninth transistor T9 is turned on, and the first power terminal VGL inputs the low-level signal to the fourth node N4, the tenth transistor T10 is turned on, and the fourth node inputs the low-level signal to the third node, the eleventh transistor T11 is turned on, and the first power terminal VGL inputs the low-level signal to the second output terminal OUT2.

In a second stage T2, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 maintains the low-level signal of the previous stage, the eleventh transistor T11 is turned on, and the first power terminal VGL inputs the low-level signal to the second output terminal OUT2.

In a third stage T3, the input signal terminal INPUT and the second clock signal terminal output the high-level signals, and the first clock signal terminal CLK1 outputs the low-level signal. The first transistor is turned on, and the first power terminal inputs the low-level signal to the first node. The second transistor is turned on, and the input signal terminal inputs the high-level signal to the second node. The sixth transistor T6 is turned on, and the second power terminal VGH inputs the high-level signal to the first output terminal OUT1. Meanwhile, the ninth transistor T9 is turned on, and the first power terminal VGL inputs the low-level signal to the fourth node N4, the tenth transistor T10 is turned on, and the fourth node inputs the low-level signal to the third node, the eleventh transistor T11 is turned on, and the first power terminal VGL inputs the low-level signal to the second output terminal OUT2.

In a fourth stage T4, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 maintains the low-level signal of the previous stage, the eleventh transistor T11 is turned on, and the first power terminal VGL inputs the low-level signal to the second output terminal OUT2.

In a fifth stage T5, the input signal terminal INPUT and the first clock signal terminal CLK1 output the low-level signals, and the second clock signal terminal CLK2 outputs the high-level signal. The first transistor T1 and the second transistor T2 are turned on, and the first power terminal VGL inputs the low-level signal to the first node N1, the input signal terminal inputs the low-level signal to the second node, and the second clock signal terminal CLK2 and the second power terminal VGH simultaneously input the high-level signals to the first output terminal OUT1. Meanwhile, the ninth transistors T9 and the tenth transistor T10 are turned on, and the first power terminal inputs the low-level signal to the fourth node. The eighth transistor is turned on, and the second clock signal terminal inputs the high-level signal to the third node. A driving capability of the second clock signal terminal can be greater than the driving capability of the first power terminal, and in this case, the third node can be m the high-level signal, and the eleventh transistor is turned off. The twelfth transistor is turned on, and the second power terminal inputs the high-level signal to the second output terminal.

In a sixth stage, the input signal terminal INPUT and the first clock signal terminal output the high-level signals, the second clock signal terminal outputs the low-level signal, and the second node maintains the low-level signal of the previous stage. The third transistor is turned on, and the first clock signal terminal inputs the high-level signal to the first node to turn off the sixth transistor. The seventh transistor is turned on, and the second clock signal terminal inputs the low-level signal to the first output terminal. Meanwhile, the fourth node maintains the low-level signal of the previous stage, the tenth transistor is turned on, and the fourth node inputs the low-level signal to the third node, the eleventh transistor is turned on, and the first power terminal inputs the low-level signal to the second output terminal.

In a seventh stage, the input signal terminal INPUT and the second clock signal terminal output the high-level signals, and the first clock signal terminal outputs the low-level signal. The first transistor is turned on, and the first power terminal inputs the low-level signal to the first node. The second transistor is turned on, and the input signal terminal inputs the high-level signal to the second node. The sixth transistor is turned on, and the second power terminal inputs the high-level signal to the first output terminal. Meanwhile, the ninth transistor T9 and the tenth transistor T10 are turned on, the first power terminal inputs the low-level signal to the third node, the eleventh transistor is turned on, and the first power terminal inputs the low-level signal to the second output terminal.

In an eighth stage, the input signal terminal and the first clock signal terminal output the high-level signals, the second clock signal terminal outputs the low-level signal, and the first node maintains the low-level signal of the previous stage. The fourth transistor, the fifth transistor and the sixth transistor are turned on, and the second power terminal inputs the high-level signal to the second node and the first output terminal. Meanwhile, the third node maintains the low-level signal of the previous stage, and the second output terminal outputs the low-level signal. In the second stage, the fourth stage and the eighth stage, the signal of the second clock signal terminal changes from the high level to the low level, and the voltage of the fourth node will be reduced under the coupling effect of the capacitor C3, so that the degree of conduction of the tenth transistor can be increased. It should be noted that, in the fifth stage, both the second clock signal terminal and the first power terminal in the shift register unit are coupled to the third node, which may cause occurrence of a step in the high-level signal output by the second output terminal.

Figure 14:
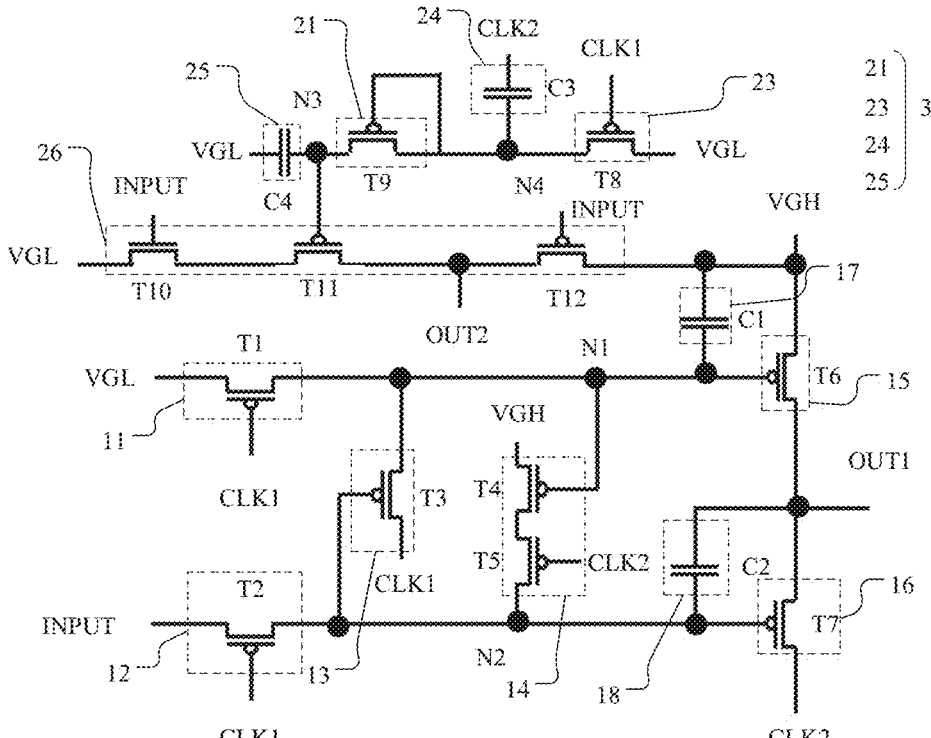
FIG. 14 is a schematic structural diagram of another embodiment of a shift register unit of the present disclosure.

FIG. 14 is a schematic structural diagram of another embodiment of a shift register unit of the present disclosure, and as shown in FIG. 14, the signal terminal group may include an input signal terminal INPUT and at least one clock signal terminal (e.g., a first clock signal terminal CLK1 and a second clock signal terminal CLK2), and the second shift register circuit may include a control circuit 3 and a third output circuit 26. The control circuit 3 can be coupled to the input signal terminal INPUT, the at least one clock signal terminal and the third node N3, and can be configured to input a control signal to the third node N3 in response to signals of the input signal terminal INPUT and the at least one clock signal terminal. The third output circuit 26 can be coupled to the third node N3, the input signal terminal INPUT and the second output terminal OUT2, and can be configured to input the second shift signal to the second output terminal OUT2 in response to signals of the third node N3 and the input signal terminal INPUT. The at least one clock signal terminal may include the first clock signal terminal CLK1 and the second clock signal terminal CLK2, and the signal terminal group may further include a first power terminal VGL and a second power terminal VGH. A structure of the first shift register circuit in the shift register unit is the same as a structure of the first shift register circuit in FIG. 12.

In the embodiments of the present disclosure, the second shift register circuit may include at least one N-type transistor and at least one P-type transistor. As shown in FIG. 14, the control circuit may include a third control circuit 23, a first coupling circuit 24, a third input circuit 21 and a third storage circuit 25. The third control circuit 23 can be coupled to the first clock signal terminal CLK1, the first power terminal VGL and the fourth node N4, and can be configured to transmit a signal of the first power terminal VGL to the fourth node N4 in response to a signal of the first clock signal terminal CLK1. The first coupling circuit 24 can be coupled between the fourth node N4 and the second clock signal terminal CLK2, and can be configured to couple the signal of the second clock signal terminal CLK2 to the fourth node N4. The third input circuit 21 is coupled to the fourth node N4 and the third node N3, and is configured to transmit a signal of the fourth node N4 to the third node N3 in response to the signal of the fourth node N4. The third storage circuit 25 can be coupled to the third node N3. The third output circuit 26 can be coupled to the first power terminal VGL, the second output terminal OUT2, the input signal terminal INPUT, the third node N3 and the second power terminal VGH, and can be configured to transmit the signal of the first power terminal VGL to the second output terminal OUT2 in response to signals of the input signal terminal INPUT and the third node N3, or transmit a signal of the second power terminal VGH to the second output terminal OUT2 in response to the signal of the input signal terminal INPUT.

In the embodiments of the present disclosure, the first to seventh transistors T7 can be the P-type transistors. The third control circuit 23 may include an eighth transistor T8, a first electrode of the eighth transistor T8 is coupled to the first power terminal VGL, a second electrode of the eighth transistor T8 is coupled to the fourth node N4, and a gate of the eighth transistor T8 is coupled to the first clock signal terminal CLK1. The first coupling circuit 24 may include a third capacitor C3 coupled between the fourth node N4 and the second clock signal terminal CLK2. The third input circuit 21 may include a ninth transistor T9, a first electrode of the ninth transistor T9 is coupled to the fourth node N4, a second electrode of the ninth transistor T9 is coupled to the third node N3, and a gate of the ninth transistor T3 is coupled to the fourth node N4. The third storage circuit 25 may include a fourth capacitor C4 coupled between the third node N3 and the first power terminal VGL. The third output circuit 26 may include a tenth transistor T10, an eleventh transistor T11 and a twelfth transistor T12, a first electrode of the tenth transistor is coupled to the first power terminal VGL, and a gate of the tenth transistor is coupled to the input signal terminal INPUT, a first electrode of the eleventh transistor is coupled to a second electrode of the tenth transistor, a second electrode of the eleventh transistor is coupled to the second output terminal OUT2, and a gate of the eleventh transistor is coupled to the third node N3, and a first electrode of the twelfth transistor is coupled to the second power terminal VGH, a second electrode of the twelfth transistor is coupled to the second output terminal OUT2, and a gate of the twelfth transistor is coupled to the input signal terminal INPUT. The tenth transistor T10 can be the N-type transistor, and the eighth transistor T8, the ninth transistor T9, the eleventh transistor T11 and the twelfth transistor T12 can be the P-type transistors.

In an embodiment of the present disclosure, the first power terminal can be the low-level signal terminal, and the second power terminal can be the high-level signal terminal. It should be understood that in other embodiments of the present disclosure, the first input circuit 11, the second input circuit 12, the first control circuit 13, the second control circuit 14, the first output circuit 15, the second output circuit 16, the first storage circuit 17, the second storage circuit 18, the third input circuit 21, the third control circuit 23, the first coupling circuit 24, the fourth input circuit 22, the third storage circuit 25 and the third output circuit 26 may have other structures.

Figure 15:
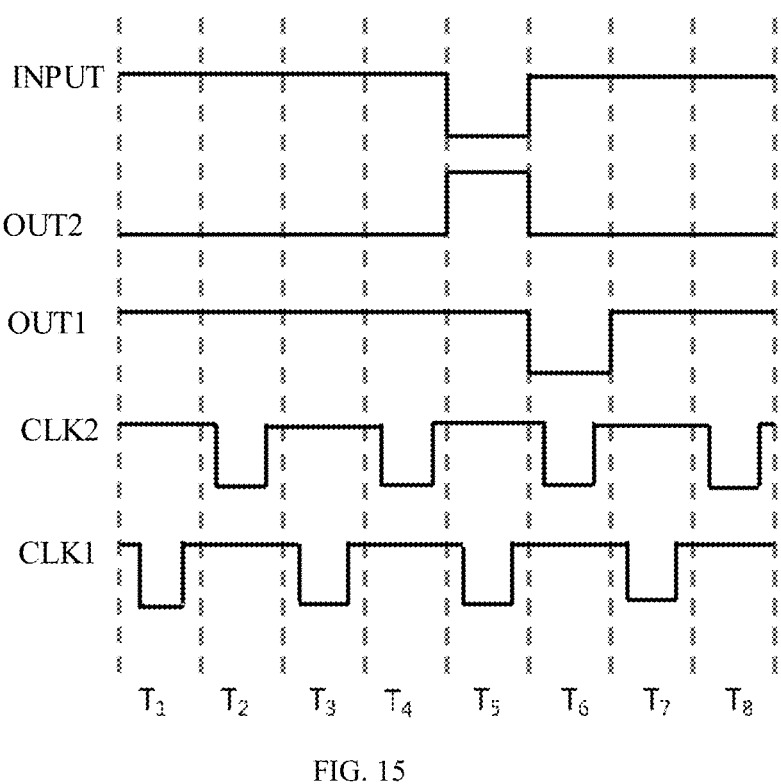
FIG. 15 is a timing diagram of each node in FIG. 14.

FIG. 15 is a timing diagram of each node in FIG. 14, and as shown in FIG. 15, INPUT is a timing of the input signal terminal, OUT1 is a timing of the first output terminal, OUT2 is a timing of the second output terminal, CLK1 is a timing of the first clock signal terminal, and CLK2 is a timing of the second clock signal terminal. The driving method for the shift register unit may include eight stages.

In a first stage T1, the input signal terminal INPUT and the second clock signal terminal output the high-level signals, and the first clock signal terminal CLK1 outputs the low-level signal. The first transistor is turned on, and the first power terminal inputs the low-level signal to the first node. The second transistor is turned on, and the input signal terminal inputs the high-level signal to the second node. The sixth transistor T6 is turned on, and the second power terminal VGH inputs the high-level signal to the first output terminal OUT1. Meanwhile, the eighth transistor T8 is turned on, and the first power terminal VGL inputs the low-level signal to the fourth node N4, the ninth transistor T9 is turned on, and the fourth node inputs the low-level signal to the third node. The tenth transistor T10 and the eleventh transistor T11 are turned on, and the first power terminal VGL inputs the low-level signal to the second output terminal OUT2.

In a second stage T2, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 and the fourth node N4 maintain the low-level signals of the previous stage, the tenth transistor and the eleventh transistor T11 are turned on, and the first power terminal VGL inputs the low-level signal to the second output terminal OUT2.

In a third stage T3, the input signal terminal INPUT and the second clock signal terminal output the high-level signals, and the first clock signal terminal CLK1 outputs the low-level signal. The first transistor is turned on, and the first power terminal inputs the low-level signal to the first node. The second transistor is turned on, and the input signal terminal inputs the high-level signal to the second node. The sixth transistor T6 is turned on, and the second power terminal VGH inputs the high-level signal to the first output terminal OUT1. The eighth transistor T8 is turned on, and the first power terminal VGL inputs the low-level signal to the fourth node N4, the ninth transistor T9 is turned on, and the fourth node inputs the low-level signal to the third node. The tenth transistor T10 and the eleventh transistor T11 are turned on, and the first power terminal VGL inputs the low-level signal to the second output terminal OUT2.

In a fourth stage T4, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the third node N3 and the fourth node N4 maintain the low-level signals of the previous stage, the tenth transistor and the eleventh transistor T11 are turned on, and the first power terminal VGL inputs the low-level signal to the second output terminal OUT2.

In a fifth stage T5, the input signal terminal INPUT and the first clock signal terminal CLK1 output the low-level signals, and the second clock signal terminal CLK2 outputs the high-level signal. The first transistor T1 and the second transistor T2 are turned on, and the first power terminal VGL inputs the low-level signal to the first node N1, the input signal terminal inputs the low-level signal to the second node, and the second clock signal terminal CLK2 and the second power terminal VGH simultaneously input the high-level signals to the first output terminal OUT1. Meanwhile, the twelfth transistor is turned on, and the second power terminal inputs the high-level signal to the second output terminal.

In a sixth stage, the input signal terminal INPUT and the first clock signal terminal output the high-level signals, the second clock signal terminal outputs the low-level signal, and the second node maintains the low-level signal of the previous stage. The third transistor is turned on, and the first clock signal terminal inputs the high-level signal to the first node to turn off the sixth transistor. The seventh transistor is turned on, and the second clock signal terminal inputs the low-level signal to the first output terminal. Meanwhile, the third node N3 and the fourth node N4 maintain the low-level signals of the previous stage, the tenth transistor and the eleventh transistor T11 are turned on, and the first power terminal VGL inputs the low-level signal to the second output terminal OUT2.

In a seventh stage, the input signal terminal INPUT and the second clock signal terminal output the high-level signals, and the first clock signal terminal outputs the low-level signal. The first transistor is turned on, and the first power terminal inputs the low-level signal to the first node. The second transistor is turned on, and the input signal terminal inputs the high-level signal to the second node. The sixth transistor is turned on, and the second power terminal inputs the high-level signal to the first output terminal. Meanwhile, the eighth transistor T8 is turned on, and the first power terminal VGL inputs the low-level signal to the fourth node N4, the ninth transistor T9 is turned on, and the fourth node inputs the low-level signal to the third node. The tenth transistor T10 and the eleventh transistor T11 are turned on, and the first power terminal VGL inputs the low-level signal to the second output terminal OUT2.

In an eighth stage, the input signal terminal and the first clock signal terminal output the high-level signals, the second clock signal terminal outputs the low-level signal, and the first node maintains the low-level signal of the previous stage. The fourth transistor, the fifth transistor and the sixth transistor are turned on, and the second power terminal inputs the high-level signal to the second node and the first output terminal. Meanwhile, the third node N3 and the fourth node N4 maintain the low-level signals of the previous stage, the tenth transistor and the eleventh transistor T11 are turned on, and the first power terminal VGL inputs the low-level signal to the second output terminal OUT2. In the second stage, the fourth stage and the eighth stage, the signal of the second clock signal terminal changes from the high level to the low level, and the voltage of the fourth node will be reduced under the coupling effect of the capacitor C3, so that the degree of conduction of the ninth transistor can be increased. It should be noted that the input signal terminal INPUT is coupled to both the gate of the tenth transistor and the gate of the twelfth transistor, and when the input signal terminal is at an intermediate voltage, such as +2V, both the tenth transistor and the twelfth transistor will be turned on, affecting an output effect of the second output terminal.

Figure 16:
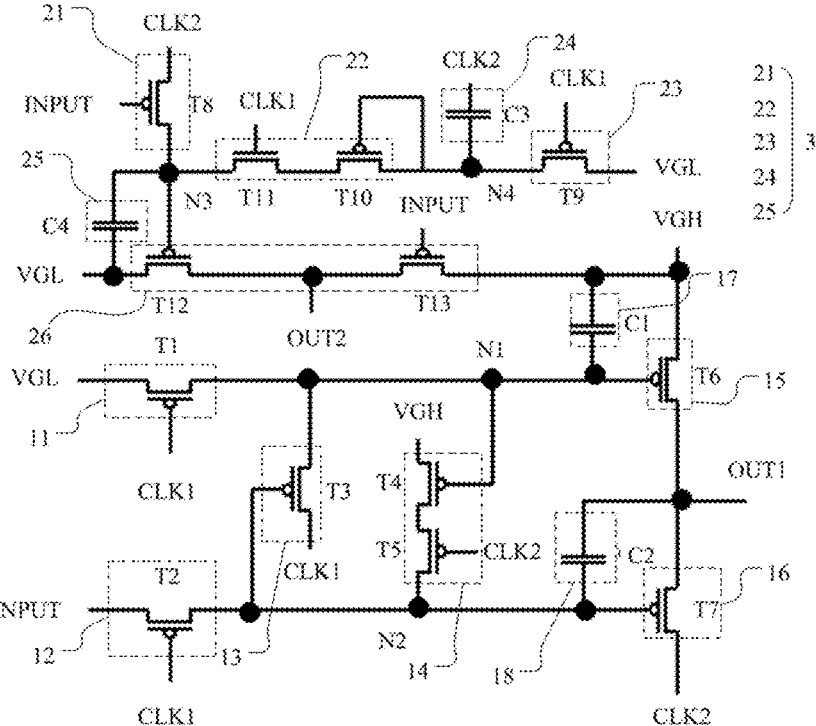
FIG. 16 is a schematic structural diagram of another embodiment of a shift register unit of the present disclosure.

In the embodiments of the present disclosure, FIG. 16 is a schematic structural diagram of another embodiment of a shift register unit of the present disclosure, and as shown in FIG. 16, the signal terminal group may include an input signal terminal INPUT and at least one clock signal terminal (e.g., a first clock signal terminal CLK1 and a second clock signal terminal CLK2), and the second shift register circuit may include a control circuit 3 and a third output circuit 26. The control circuit 3 can be coupled to the input signal terminal INPUT, the at least one clock signal terminal and the third node N3, and can be configured to input a control signal to the third node N3 in response to signals of the input signal terminal INPUT and the at least one clock signal terminal. The third output circuit 26 can be coupled to the third node N3, the input signal terminal INPUT and the second output terminal OUT2, and can be configured to input the second shift signal to the second output terminal OUT2 in response to signals of the third node N3 and the input signal terminal INPUT. The at least one clock signal terminal may include the first clock signal terminal CLK1 and the second clock signal terminal CLK2, and the signal terminal group may further include a first power terminal VGL and a second power terminal VGH. The structure of the first shift register circuit in the shift register unit is the same as the structure of the first shift register circuit in FIG. 12.

The control circuit may include a third input circuit 21, a third control circuit 23, a first coupling circuit 24, a fourth input circuit 22 and a third storage circuit 25. The third input circuit 21 is coupled to the second clock signal terminal CLK2, the input signal terminal INPUT and the third node N3, and is configured to transmit a signal of the second clock signal terminal CLK2 to the third node N3 in response to a signal of the input signal terminal INPUT. The third control circuit 23 can be coupled to the first power terminal VGL, the first clock signal terminal CLK1 and the fourth node N4, and can be configured to transmit the signal of the first power terminal VGL to the fourth node N4 in response to the signal of the first clock signal terminal CLK1. The first coupling circuit 24 can be coupled between the second clock signal terminal CLK2 and the fourth node N4, and can be configured to couple the signal of the second clock signal terminal CLK2 to the fourth node N4. The fourth input circuit 22 can be coupled to the fourth node N4, the third node N3 and the first clock signal terminal CLK1, and can be configured to transmit a signal of the fourth node N4 to the third node N3 in response to signals of the fourth node N4 and the first clock signal terminal CLK1. The third output circuit 26 can be coupled to the first power terminal VGL, the second output terminal OUT2, the second power terminal VGH and the input signal terminal INPUT, and can be configured to transmit the signal of the first power terminal VGL to the second output terminal OUT2 in response to a signal of the third node N3, or transmit a signal of the second power terminal VGH to the second output terminal OUT2 in response to the signal of the input signal terminal INPUT The third storage circuit 25 can be coupled to the third node N3.

In the embodiments of the present disclosure, as shown in FIG. 16, the first to seventh transistors T7 can be the P-type transistors. The third input circuit 21 may include an eighth transistor T8, a first electrode of the eighth transistor T8 is coupled to the second clock signal terminal CLK2, a second electrode of the eighth transistor T8 is coupled to the third node N3, and a gate of the eighth transistor T8 is coupled to the input signal terminal INPUT. The third control circuit 23 may include a ninth transistor T9, a first electrode of the ninth transistor T9 is coupled to the first power terminal VGL, a second electrode of the ninth transistor T9 is coupled to the fourth node N4, and a gate of the ninth transistor T9 is coupled to the first clock signal terminal CLK1. The first coupling circuit 24 may include a third capacitor C3 coupled between the second clock signal terminal CLK2 and the fourth node N4. The fourth input circuit 22 may include a tenth transistor T10 and an eleventh transistor T11, a first electrode of the tenth transistor T10 is coupled to the fourth node N4, and a gate of the tenth transistor T10 is coupled to the fourth node N4, and a first electrode of the eleventh transistor T11 is coupled to a second electrode of the tenth transistor T10, a second electrode of the eleventh transistor T11 is coupled to the third node N3, and a gate of the eleventh transistor T11 is coupled to the first clock signal terminal CLK1. The third output circuit 26 may include a twelfth transistor T12 and a thirteenth transistor T13, a first electrode of the twelfth transistor T12 is coupled to the first power terminal VGL, a second electrode of the twelfth transistor T12 is coupled to the second output terminal OUT2, and a gate of the twelfth transistor T12 is coupled to the third node N3, and a first electrode of the thirteenth transistor T13 is coupled to the second power terminal VGH, a second electrode of the thirteenth transistor T13 is coupled to the second output terminal OUT2, and a gate of the thirteenth transistor T13 is coupled to the input signal terminal INPUT. The third storage circuit 25 may include a fourth capacitor C4 coupled between the third node N3 and the first power terminal VGL. The eleventh transistor T11 can be the N-type transistor, and the eighth transistor T8, the ninth transistor T9, the tenth transistor T10, the twelfth transistor T12 and the thirteenth transistor T13 can be the P-type transistors.

Figure 17:
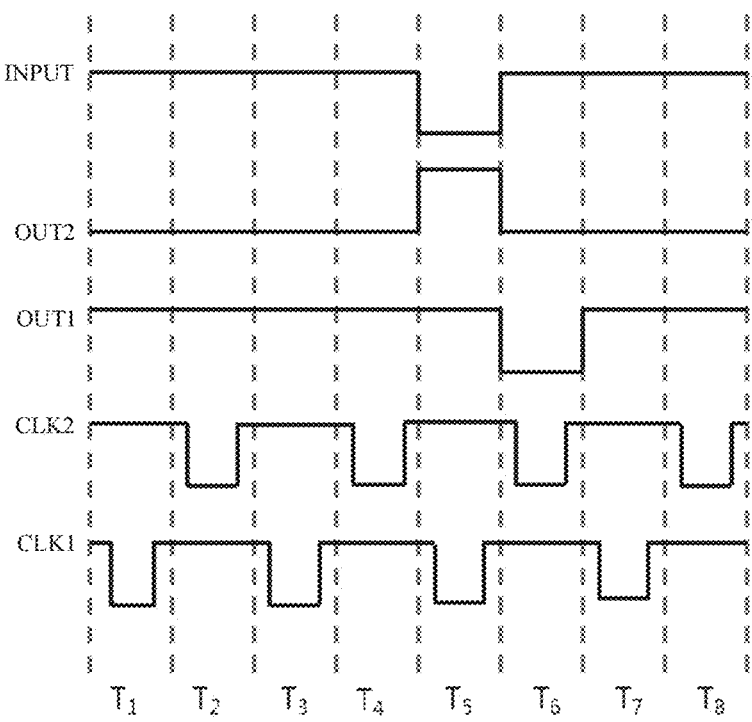
FIG. 17 is a timing diagram of each node in FIG. 16.

FIG. 17 is a timing diagram of each node in FIG. 16, and as shown in FIG. 17, INPUT is a timing of the input signal terminal, OUT1 is a timing of the first output terminal, OUT2 is a timing of the second output terminal, CLK1 is a timing of the first clock signal terminal, and CLK2 is a timing of the second clock signal terminal. The driving method for the shift register unit may include eight stages.

Figure 18:
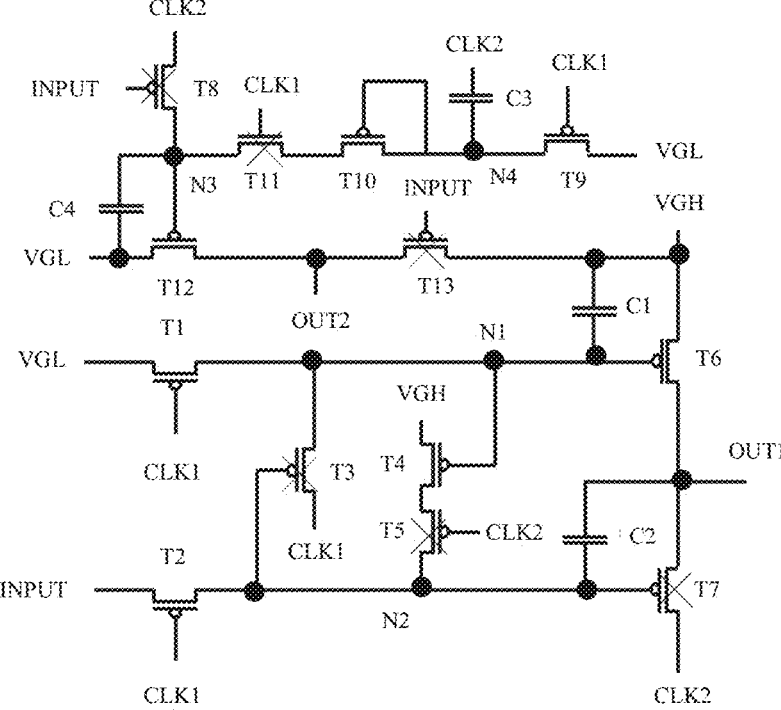
FIG. 18 is a state diagram of the shift register unit shown in FIG. 16 in a first stage.

FIG. 18 is a state diagram of the shift register unit shown in FIG. 16 in a first stage, and as shown in FIG. 18, a crossed transistor is turned off, and an uncrossed transistor is turned on. In the first stage T1, the input signal terminal INPUT and the second clock signal terminal output the high-level signals, and the first clock signal terminal CLK1 outputs the low-level signal. The first transistor is turned on, and the first power terminal inputs the low-level signal to the first node. The second transistor is turned on, and the input signal terminal inputs the high-level signal to the second node. The sixth transistor T6 is turned on, and the second power terminal VGH inputs the high-level signal to the first output terminal OUT1. Meanwhile, the four node maintains the voltage of the previous stage, the twelfth transistor is turned on, and the first power terminal VGL inputs the low-level signal to the second output terminal OUT2.

Figure 19:
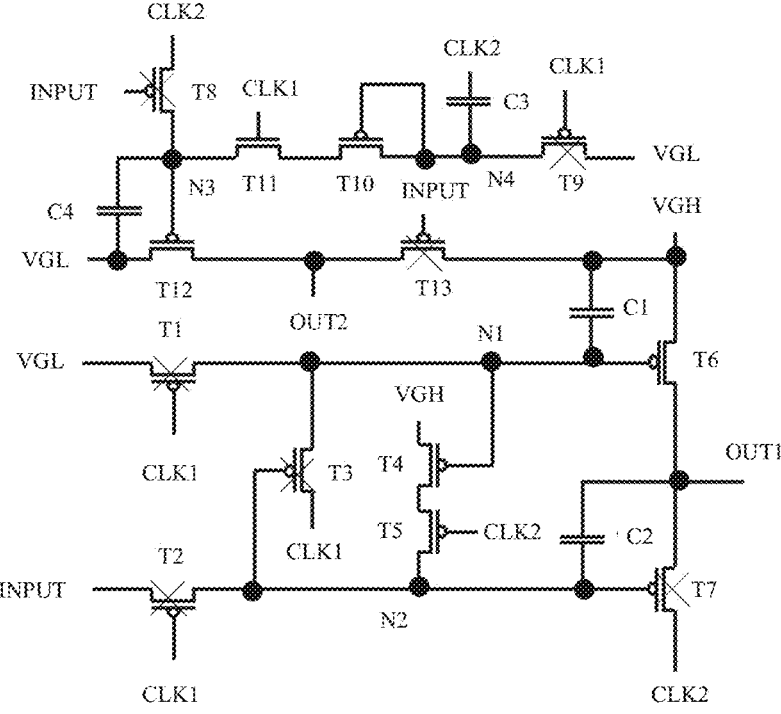
FIG. 19 is a state diagram of the shift register unit shown in FIG. 16 in a second stage.

FIG. 19 is a state diagram of the shift register unit shown in FIG. 16 in a second stage, and as shown in FIG. 19, the crossed transistor is turned off, and the uncrossed transistor is turned on. In the second stage T2, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the voltage of the second clock signal terminal changes from the high level to the low level, the voltage of the fourth node decreases, the tenth transistor and the eleventh transistor are turned on, and the fourth node inputs the low-level signal to the third node, the twelfth transistor T12 is turned on, the first power terminal VGL inputs the low-level signal to the second output terminal OUT2.

In a third stage T3, on states and off states of transistors in the shift register unit are shown in FIG. 18, the input signal terminal INPUT and the second clock signal terminal output the high-level signals, and the first clock signal terminal CLK1 outputs the low-level signal. The first transistor is turned on, and the first power terminal inputs the low-level signal to the first node. The second transistor is turned on, and the input signal terminal inputs the high-level signal to the second node. The sixth transistor T6 is turned on, and the second power terminal VGH inputs the high-level signal to the first output terminal OUT1. Meanwhile, the four node maintains the voltage of the previous stage, the twelfth transistor is turned on, and the first power terminal VGL inputs the low-level signal to the second output terminal OUT2.

In a fourth stage T4, the on states and off states of the transistors in the shift register unit are shown in FIG. 19, the input signal terminal INPUT and the first clock signal terminal CLK1 output the high-level signals, the second clock signal terminal CLK2 outputs the low-level signal, and the first node N1 maintains the low-level signal of the previous stage. The fourth transistor, the fifth transistor and the sixth transistor are turned on, and the second power terminal VGH inputs the high-level signal to the second node, the second power terminal VGH inputs the high-level signal to the first output terminal. Meanwhile, the voltage of the second clock signal terminal changes from the high level to the low level, and under a bootstrapping action of the third capacitor C3, the voltage of the fourth node decreases, the tenth transistor and the eleventh transistor are turned on, and the fourth node inputs the low-level signal to the third node, the twelfth transistor T12 is turned on, the first power terminal VGL inputs the low-level signal to the second output terminal OUT2.

Figure 20:
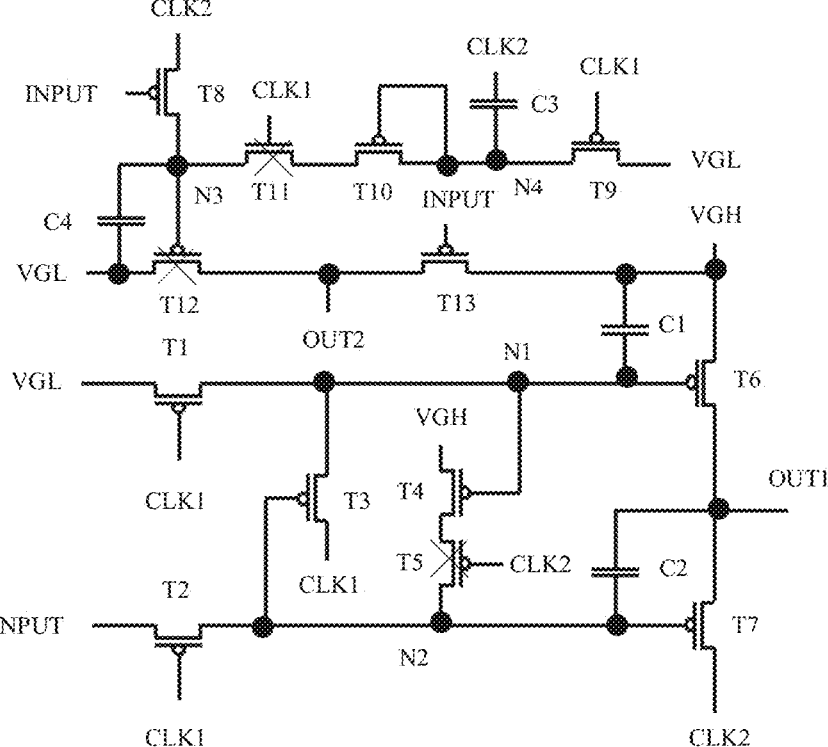
FIG. 20 is a state diagram of the shift register unit shown in FIG. 16 in a fifth stage.

FIG. 20 is a state diagram of the shift register unit shown in FIG. 16 in a fifth stage, and as shown in FIG. 20, the crossed transistor is turned off, and the uncrossed transistor is turned on. In the fifth stage T5, the input signal terminal INPUT and the first clock signal terminal CLK1 output the low-level signals, and the second clock signal terminal CLK2 outputs the high-level signal. The first transistor T1 and the second transistor T2 are turned on, and the first power terminal VGL inputs the low-level signal to the first node N1, the input signal terminal inputs the low-level signal to the second node, and the second clock signal terminal CLK2 and the second power terminal VGH simultaneously input the high-level signals to the first output terminal OUT1. At this time, the first output terminal OUT1 changes from the high level to the low level, and the voltage of the second node is further reduced under the bootstrapping action of the second capacitor C2. Meanwhile, the thirteenth transistor is turned on, and the second power terminal inputs the high-level signal to the second output terminal.

Figure 21:
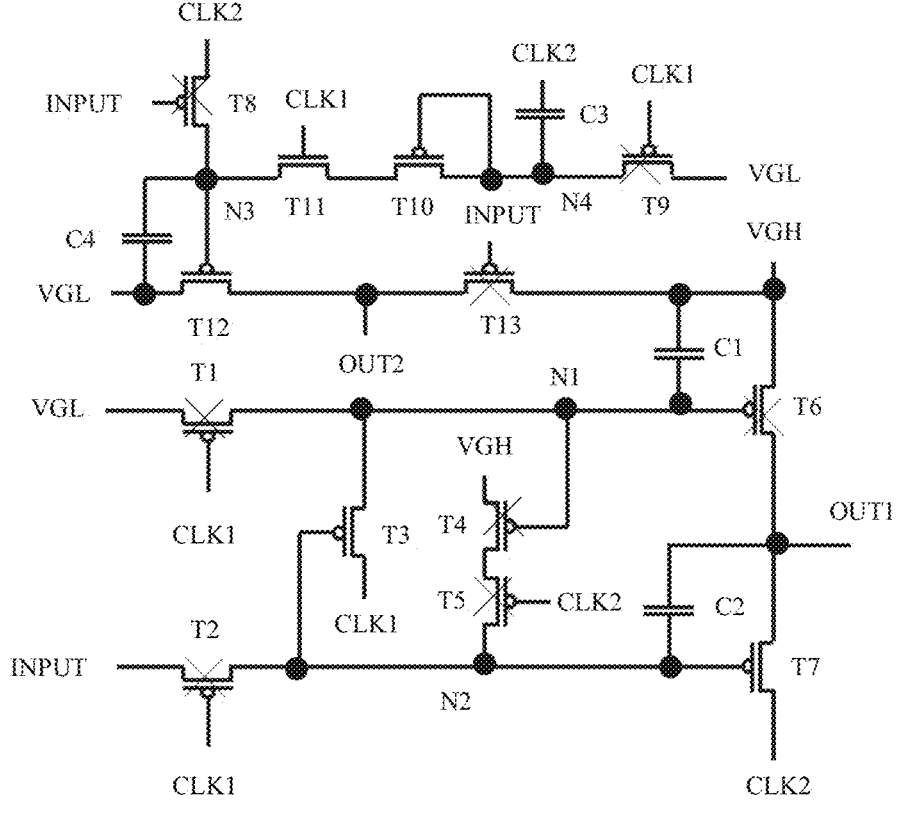
FIG. 21 is a state diagram of the shift register unit shown in FIG. 16 in a sixth stage.

FIG. 21 is a state diagram of the shift register unit shown in FIG. 16 in a sixth stage, and as shown in FIG. 21, the crossed transistor is turned off, and the uncrossed transistor is turned on. In the sixth stage, the input signal terminal INPUT and the first clock signal terminal output the high-level signals, the second clock signal terminal outputs the low-level signal, and the second node maintains the low-level signal of the previous stage. The third transistor is turned on, and the first clock signal terminal inputs the high-level signal to the first node to turn off the sixth transistor. The seventh transistor is turned on, and the second clock signal terminal inputs the low-level signal to the first output terminal. Meanwhile, the voltage of the second clock signal terminal changes from the high level to the low level, and under the bootstrapping action of the third capacitor C3, the voltage of the fourth node decreases, the tenth transistor and the eleventh transistor are turned on, and the fourth node inputs the low-level signal to the third node, the twelfth transistor T12 is turned on, the first power terminal VGL inputs the low-level signal to the second output terminal OUT2.

In a seventh stage, the on states and off states of the transistors in the shift register unit are the same as the on states and off states of the transistors in the first stage, the second power terminal inputs the high-level signal to the first output terminal, and the first power terminal VGL inputs the low-level signal to the second output terminal OUT2. In an eighth stage, the on states and off states of the transistors in the shift register unit are the same as the on states and off states of the transistors in the second stage, the second power terminal inputs the high-level signal to the second node and the first output terminal, and the first power terminal VGL inputs the low-level signal to the second output terminal OUT2.

It should be noted that, FIGS. 8, 10, 12, 14 and 16 show three types of first shift register circuits and five types of second shift register circuits, respectively, and the three types of first shift register circuits and the five types of second shift register circuits can be combined in any manner to form a new shift register unit, which belongs to the protection scope of the present disclosure.

The embodiments of the present disclosure further provide a gate driving circuit, and the gate driving circuit may include a plurality of the above-mentioned shift register units. The plurality of shift register units are cascaded in sequence, an output terminal of the previous-stage shift register unit can be coupled to an input terminal of the next-stage shift register unit, and an input terminal of a first-stage shift register unit can be coupled to the initial signal terminal.

The embodiments of the present disclosure further provide a display panel, and the display panel includes a pixel driving circuit and the above-mentioned gate driving circuit. The pixel driving circuit may include a P-type driving transistor, a N-type switching transistor and a P-type switching transistor. For example, the pixel driving circuit can be as shown in FIG. 1. A first electrode of the N-type switching transistor is coupled to a gate of the driving transistor, and a first electrode of the P-type switching transistor is coupled to a first electrode of the driving transistor. The first output terminal OUT1 of the shift register unit in the gate driving circuit is configured to provide the gate driving signal to the P-type switching transistor, and the second output terminal OUT2 of the shift register unit in the gate driving circuit is configured to provide the gate driving signal to the N-type switching transistor. The display panel can be used to form a display device such as a mobile phone and a tablet computer. The transistors in the pixel driving circuit and the transistors in the gate driving circuit can be formed by one patterning process.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A shift register unit, comprising:
    a first shift register circuit, coupled to a signal terminal group and a first output terminal, and configured to output a first shift signal to the first output terminal in response to a signal of the signal terminal group; and
    a second shift register circuit, coupled with the first shift register circuit, wherein the second shift register circuit is coupled to the same signal terminal group as the first shift register circuit and a second output terminal, and is configured to output a second shift signal to the second output terminal in response to the signal of the signal terminal group;
    wherein an active level of the first shift signal and an active level of the second shift signal are logically opposite;
    wherein the signal terminal group comprises an input signal terminal, a first clock signal terminal, a second clock signal terminal, a first power terminal and a second power terminal;
    the first shift register circuit comprises:
    a first input circuit, coupled to the first power terminal, the first clock signal terminal and a first node, and configured to transmit a signal of the first power terminal to the first node in response to a signal of the first clock signal terminal;
    a second input circuit, coupled to the first power terminal, the input signal terminal and a second node, and configured to transmit the signal of the first power terminal to the second node in response to a signal of the input signal terminal;
    a first control circuit, coupled to the first node, the second node and a pull-up node, and configured to transmit a signal of the pull-up node to the first node in response to a signal of the second node, wherein the pull-up node is the first clock signal terminal or the second power terminal;
    a second control circuit, coupled to the first node, the second node, the second power terminal and the second clock signal terminal, and configured to transmit a signal of the second power terminal to the second node in response to signals of the first node and the second clock signal terminal;
    a first output circuit, coupled to the second power terminal, the first output terminal and the first node, and configured to transmit the signal of the second power terminal to the first output terminal in response to a signal of the first node;
    a second output circuit, coupled to the second clock signal terminal, the second node and the first output terminal, and configured to transmit a signal of the second clock signal terminal to the first output terminal in response to the signal of the second node;
    a first storage circuit, coupled to the first node; and
    a second storage circuit, coupled to the second node,
    wherein the first input circuit comprises:
    a first transistor, wherein a first electrode of the first transistor is coupled to the first power terminal, a second electrode of the first transistor is coupled to the first node, and a gate of the first transistor is coupled to the first clock signal terminal;
    the second input circuit comprises:

a second transistor, wherein a first electrode of the second transistor is coupled to the first power terminal, a second electrode of the second transistor is coupled to the second node, and a gate of the second transistor is coupled to the input signal terminal;

the first control circuit comprises:

a third transistor, wherein a first electrode of the third transistor is coupled to the pull-up node, a second electrode of the third transistor is coupled to the first node, and a gate of the third transistor is coupled to the second node;

the second control circuit comprises:

a fourth transistor, wherein a first electrode of the fourth transistor is coupled to the second power terminal, and a gate of the fourth transistor is coupled to the first node; and a fifth transistor, wherein a first electrode of the fifth transistor is coupled to a second electrode of the fourth transistor, a second electrode of the fifth transistor is coupled to the second node, and a gate of the fifth transistor is coupled to the second clock signal terminal;

the first output circuit comprises:

a sixth transistor, wherein a first electrode of the sixth transistor is coupled to the second power terminal, a second electrode of the sixth transistor is coupled to the first output terminal, and a gate of the sixth transistor is coupled to the first node;

the second output circuit comprises:

a seventh transistor, wherein a first electrode of the seventh transistor is coupled to the second clock signal terminal, a second electrode of the seventh transistor is coupled to the first output terminal, and a gate of the seventh transistor is coupled to the second node;

the first storage circuit comprises:

a first capacitor, coupled between the second power terminal and the first node; and the second storage circuit comprises:

a second capacitor, coupled between the second node and the first output terminal.

2. The shift register unit according to claim 1, wherein the signal terminal group comprises at least one clock signal terminal, and the second shift register circuit comprises:

a control circuit, coupled to the second node, the at least one clock signal terminal and a third node, and configured to input a control signal to the third node in response to signals of the second node and the at least one clock signal terminal; and a third output circuit, coupled to the third node, the at least one clock signal terminal and the second output terminal, and configured to input the second shift signal to the second output terminal in response to signals of the third node and the at least one clock signal terminal.

3. The shift register unit according to claim 2, wherein the at least one clock signal terminal comprises the first clock signal terminal and the second clock signal terminal;

the control circuit comprises:

a third input circuit, coupled to the second power terminal, the second node, the second clock signal terminal and the third node, and configure to transmit a signal of the second power terminal to the third node in response to signals of the second node and the second clock signal terminal;

a fourth input circuit, coupled to the first power terminal, the first clock signal terminal and the third node, and configure to transmit a signal of the first power terminal to the third node in response to a signal of the first clock signal terminal;

a third storage circuit, coupled between the third node and a fourth node;

a first coupling circuit, coupled between the fourth node and the second clock signal terminal; and a third control circuit, coupled to the fourth node, the second node and the second power terminal, and configured to transmit the signal of the second power terminal to the fourth node in response to a signal of the second node; and the third output circuit is coupled to the first power terminal, the second output terminal, the third node, the second power terminal, the second node and the second clock signal terminal, and is configured to transmit the signal of the first power terminal to the second output terminal in response to a signal of the third node, or transmit the signal of the second power terminal to the second output terminal in response to the signals of the second node and the second clock signal terminal.

4. The shift register unit according to claim 3, wherein, the third input circuit comprises:

an eighth transistor, wherein a first electrode of the eighth transistor is coupled to the second power terminal, and a gate of the eighth transistor is coupled to the second node; and a ninth transistor, wherein a first electrode of the ninth transistor is coupled to a second electrode of the eighth transistor, a second electrode of the ninth transistor is coupled to the third node, and a gate of the ninth transistor is coupled to the second clock signal terminal;

the fourth input circuit comprises:

a tenth transistor, wherein a first electrode of the tenth transistor is coupled to the first power terminal, a second electrode of the tenth transistor is coupled to the third node, and a gate of the tenth transistor is coupled to the first clock signal terminal;

the third control circuit comprises:

an eleventh transistor, wherein a first electrode of the eleventh transistor is coupled to the second power terminal, a second electrode of the eleventh transistor is coupled to the fourth node, and a gate of the eleventh transistor is coupled to the second node;

the third output circuit comprises:

a twelfth transistor, wherein a first electrode of the twelfth transistor is coupled to the first power terminal, a second electrode of the twelfth transistor is coupled to the second output terminal, and a gate of the twelfth transistor is coupled to the third node;

a thirteenth transistor, wherein a first electrode of the thirteenth transistor is coupled to the second power terminal, and a gate of the thirteenth transistor is coupled to the second node; and a fourteenth transistor, wherein a first electrode of the fourteenth transistor is coupled to a second electrode of the thirteenth transistor, a second electrode of the fourteenth transistor is coupled to the second output terminal, and a gate of the fourteenth transistor is coupled to the second clock signal terminal;

the third storage circuit comprises:

a third capacitor, coupled between the third node and the fourth node; and the first coupling circuit comprises:

a fourth capacitor, coupled between the fourth node and the second clock signal terminal.

5. The shift register unit according to claim 2, wherein the at least one clock signal terminal comprises a first clock signal terminal and a second clock signal terminal, and the signal terminal group further comprises an input signal terminal, a first power terminal and a second power terminal;

the control circuit comprises:

a third input circuit, coupled to the second power terminal, the second node and the third node, and configured to transmit a signal of the second power terminal to the third node in response to a signal of the second node;

a third control circuit, coupled to the first power terminal, the second node, the second power terminal, the first clock signal terminal and a fourth node, and configured to transmit a signal of the first power terminal to the fourth node in response to a signal of the first clock signal terminal, and transmit the signal of the second power terminal to the fourth node in response to the signal of the second node;

a first coupling circuit, coupled between the second clock signal terminal and the fourth node, and configured to couple the signal of the second clock signal terminal to the fourth node;

a fourth input circuit, coupled to the fourth node and the third node, and configured to transmit a signal of the fourth node to the third node in response to the signal of the fourth node; and a third storage circuit, coupled to the third node; and the third output circuit is coupled to the first power terminal, the second output terminal, the third node, the second clock signal terminal, the second node and the second power terminal, and is configured to transmit the signal of the first power terminal to the second output terminal in response to a signal of the third node, or transmit the signal of the second power terminal to the second output terminal in response to signals of the second node and the second clock signal terminal.

6. The shift register unit according to claim 5, wherein, the third input circuit comprises:

an eighth transistor, wherein a first electrode of the eighth transistor is coupled to the second power terminal, a second electrode of the eighth transistor is coupled to the third node, and a gate of the eighth transistor is coupled to the second node;

the third control circuit comprises:

a ninth transistor, wherein a first electrode of the ninth transistor is coupled to the first power terminal, a second electrode of the ninth transistor is coupled to the fourth node, and a gate of the ninth transistor is coupled to the first clock signal terminal; and a tenth transistor, wherein a first electrode of the tenth transistor is coupled to the second power terminal, a second electrode of the tenth transistor is coupled to the fourth node, and a gate of the tenth transistor is coupled to the second node;

the first coupling circuit comprises:

a third capacitor, coupled between the second clock signal terminal and the fourth node;

the fourth input circuit comprises:

an eleventh transistor, wherein a first electrode of the eleventh transistor is coupled to the fourth node, a second electrode of the eleventh transistor is coupled to the third node, and a gate of the eleventh transistor is coupled to the fourth node;

the third storage circuit comprises:

a fourth capacitor, coupled between the third node and the first power terminal; and the third output circuit comprises:

a twelfth transistor, wherein a first electrode of the twelfth transistor is coupled to the first power terminal, a second electrode of the twelfth transistor is coupled to the second output terminal, and a gate of the twelfth transistor is coupled to the third node;

a thirteenth transistor, wherein a first electrode of the thirteenth transistor is coupled to the second power terminal, and a gate of the thirteenth transistor is coupled to the second node; and a fourteenth transistor, wherein a first electrode of the fourteenth transistor is coupled to a second electrode of the thirteenth transistor, a second electrode of the fourteenth transistor is coupled to the second output terminal, and a gate of the fourteenth transistor is coupled to the second clock signal terminal.

7. The shift register unit according to claim 1, wherein the signal terminal group comprises an input signal terminal and at least one clock signal terminal; and the second shift register circuit comprises:

a control circuit, coupled to the input signal terminal, the at least one clock signal terminal and a third node, and configured to input a control signal to the third node in response to signals of the input signal terminal and the at least one clock signal terminal; and a third output circuit, coupled to the third node, the input signal terminal and the second output terminal, and configured to input the second shift signal to the second output terminal in response to signals of the third node and the input signal terminal.

8. The shift register unit according to claim 7, wherein the at least one clock signal terminal comprises a first clock signal terminal and a second clock signal terminal, and the signal terminal group further comprises a first power terminal and a second power terminal;

the control circuit comprises:

a third input circuit, coupled to the second clock signal terminal, the input signal terminal and the third node, and configured to transmit a signal of the second clock signal terminal to the third node in response to a signal of the input signal terminal;

a third control circuit, coupled to the first power terminal, the first clock signal terminal and a fourth node, and configured to transmit a signal of the first power terminal to the fourth node in response to a signal of the first clock signal terminal;

a first coupling circuit, coupled between the second clock signal terminal and the fourth node, and configured to couple the signal of the second clock signal terminal to the fourth node;

a fourth input circuit, coupled to the fourth node and the third node, and configured to transmit a signal of the fourth node to the third node in response to the signal of the fourth node; and a third storage circuit, coupled to the third node; and the third output circuit is coupled to the first power terminal, the third node, the second output terminal, the input signal terminal and the second power terminal, and is configured to transmit the signal of the first power terminal to the second output terminal in response to a signal of the third node, or transmit a signal of the second power terminal to the second output terminal in response to the signal of the input signal terminal.

9. The shift register unit according to claim 8, wherein, the third input circuit comprises:

an eighth transistor, wherein a first electrode of the eighth transistor is coupled to the second clock signal terminal, a second electrode of the eighth transistor is coupled to the third node, and a gate of the eighth transistor is coupled to the input signal terminal;

the third control circuit comprises:

a ninth transistor, wherein a first electrode of the ninth transistor is coupled to the first power terminal, a second electrode of the ninth transistor is coupled to the fourth node, and a gate of the ninth transistor is coupled to the first clock signal terminal;

the first coupling circuit comprises:

a third capacitor, coupled between the fourth node and the second clock signal terminal;

the fourth input circuit comprises:

a tenth transistor, wherein a first electrode of the tenth transistor is coupled to the fourth node, a second electrode of the tenth transistor is coupled to the third node, and a gate of the tenth transistor is coupled to the fourth node;

the third storage circuit comprises:

a fourth capacitor, coupled between the third node and the first power terminal; and the third output circuit comprises:

an eleventh transistor, wherein a first electrode of the eleventh transistor is coupled to the first power terminal, a second electrode of the eleventh transistor is coupled to the second output terminal, and a gate of the eleventh transistor is coupled to the third node; and a twelfth transistor, wherein a first electrode of the twelfth transistor is coupled to the second power terminal, a second electrode of the twelfth transistor is coupled to the second output terminal, and a gate of the twelfth transistor is coupled to the input signal terminal.

10. The shift register unit according to claim 7, wherein the second shift register circuit comprises at least one N-type transistor and at least one P-type transistor.

11. The shift register unit according to claim 7, wherein the at least one clock signal terminal comprises a first clock signal terminal and a second clock signal terminal, and the signal terminal group further comprises a first power terminal and a second power terminal;

the control circuit comprises:

a third control circuit, coupled to the first clock signal terminal, the first power terminal and a fourth node, and configured to transmit a signal of the first power terminal to the fourth node in response to a signal of the first clock signal terminal;

a first coupling circuit, coupled between the fourth node and the second clock signal terminal, and configured to couple a signal of the second clock signal terminal to the fourth node;

a third input circuit, coupled to the fourth node and the third node, and configured to transmit a signal of the fourth node to the third node in response to the signal of the fourth node; and a third storage circuit, coupled to the third node; and the third output circuit is coupled to the first power terminal, the second output terminal, the input signal terminal, the third node and the second power terminal, and is configured to transmit the signal of the first power terminal to the second output terminal in response to signals of the input signal terminal and the third node, or transmit a signal of the second power terminal to the second output terminal in response to a signal of the input signal terminal.

12. The shift register unit according to claim 11, wherein, the third control circuit comprises:

an eighth transistor, wherein a first electrode of the eighth transistor is coupled to the first power terminal, a second electrode of the eighth transistor is coupled to the fourth node, and a gate of the eighth transistor is coupled to the first clock signal terminal;

the first coupling circuit comprises:

a third capacitor, coupled between the fourth node and the second clock signal terminal;

the third input circuit comprises:

a ninth transistor, wherein a first electrode of the ninth transistor is coupled to the fourth node, a second electrode of the ninth transistor is coupled to the third node, and a gate of the ninth transistor is coupled to the fourth node;

the third storage circuit comprises:

a fourth capacitor, coupled between the third node and the first power terminal; and the third output circuit comprises:

a tenth transistor, wherein a first electrode of the tenth transistor is coupled to the first power terminal, and a gate of the tenth transistor is coupled to the input signal terminal;

an eleventh transistor, wherein a first electrode of the eleventh transistor is coupled to a second electrode of the tenth transistor, a second electrode of the eleventh transistor is coupled to the second output terminal, and a gate of the eleventh transistor is coupled to the third node; and a twelfth transistor, wherein a first electrode of the twelfth transistor is coupled to the second power terminal, a second electrode of the twelfth transistor is coupled to the second output terminal, and a gate of the twelfth transistor is coupled to the input signal terminal;

wherein the tenth transistor is a N-type transistor, and the eighth transistor, the ninth transistor, the eleventh transistor and the twelfth transistor are P-type transistors.

13. The shift register unit according to claim 7, wherein the at least one clock signal terminal comprises a first clock signal terminal and a second clock signal terminal, and the signal terminal group further comprises a first power terminal and a second power terminal;

the control circuit comprises:

a third input circuit, coupled to the second clock signal terminal, the input signal terminal and the third node, and configured to transmit a signal of the second clock signal terminal to the third node in response to a signal of the input signal terminal;

a third control circuit, coupled to the first power terminal, the first clock signal terminal and a fourth node, and configured to transmit a signal of the first power terminal to the fourth node in response to a signal of the first clock signal terminal;

a first coupling circuit, coupled between the second clock signal terminal and the fourth node, and configured to couple the signal of the second clock signal terminal to the fourth node;

a fourth input circuit, coupled to the fourth node, the third node and the first clock signal terminal, and configured to transmit a signal of the fourth node to the third node in response to signals of the fourth node and the first clock signal terminal; and a third storage circuit, coupled to the third node; and the third output circuit is coupled to the first power terminal, the second output terminal, the second power terminal and the input signal terminal, and is configured to transmit the signal of the first power terminal to the second output terminal in response to a signal of the third node, or transmit a signal of the second power terminal to the second output terminal in response to the signal of the input signal terminal.

14. The shift register unit according to claim 13, wherein, the third input circuit comprises:

an eighth transistor, wherein a first electrode of the eighth transistor is coupled to the second clock signal terminal, a second electrode of the eighth transistor is coupled to the third node, and a gate of the eighth transistor is coupled to the input signal terminal;

the third control circuit comprises:

a ninth transistor, wherein a first electrode of the ninth transistor is coupled to the first power terminal, a second electrode of the ninth transistor is coupled to the fourth node, and a gate of the ninth transistor is coupled to the first clock signal terminal;

the first coupling circuit comprises:

a third capacitor, coupled between the second clock signal terminal and the fourth node;

the fourth input circuit comprises:

a tenth transistor, wherein a first electrode of the tenth transistor is coupled to the fourth node, and a gate of the tenth transistor is coupled to the fourth node; and an eleventh transistor, wherein a first electrode of the eleventh transistor is coupled to a second electrode of the tenth transistor, a second electrode of the eleventh transistor is coupled to the third node, and a gate of the eleventh transistor is coupled to the first clock signal terminal;

the third output circuit comprises:

a twelfth transistor, wherein a first electrode of the twelfth transistor is coupled to the first power terminal, a second electrode of the twelfth transistor is coupled to the second output terminal, and a gate of the twelfth transistor is coupled to the third node; and a thirteenth transistor, wherein a first electrode of the thirteenth transistor is coupled to the second power terminal, a second electrode of the thirteenth transistor is coupled to the second output terminal, and a gate of the thirteenth transistor is coupled to the input signal terminal; and the third storage circuit comprises:

a fourth capacitor, coupled between the third node and the first power terminal;

wherein the eleventh transistor is a N-type transistor, and the eighth transistor, the ninth transistor, the tenth transistor, the twelfth transistor and the thirteenth transistor are P-type transistors.

15. A gate driving circuit, comprising the shift register unit according to claim 1.

16. A display panel, comprising:

a pixel driving circuit, comprising a P-type driving transistor, a N-type switching transistor and a P-type switching transistor, wherein a first electrode of the N-type switching transistor is coupled to a gate of the driving transistor, and a first electrode of the P-type switching transistor is coupled to a first electrode of the driving transistor; and a gate driving circuit, comprising a shift register unit, wherein the shift register unit comprises:

a first shift register circuit, coupled to a signal terminal group and a first output terminal, and configured to output a first shift signal to the first output terminal in response to a signal of the signal terminal group; and a second shift register circuit, coupled with the first shift register circuit, wherein the second shift register circuit is coupled to the same signal terminal group as the first shift register circuit and a second output terminal, and is configured to output a second shift signal to the second output terminal in response to the signal of the signal terminal group;

wherein an active level of the first shift signal and an active level of the second shift signal are logically opposite;

wherein the signal terminal group comprises an input signal terminal, a first clock signal terminal, a second clock signal terminal, a first power terminal and a second power terminal;

the first shift register circuit comprises:

a first input circuit, coupled to the first power terminal, the first clock signal terminal and a first node, and configured to transmit a signal of the first power terminal to the first node in response to a signal of the first clock signal terminal;

a second input circuit, coupled to the first power terminal, the input signal terminal and a second node, and configured to transmit the signal of the first power terminal to the second node in response to a signal of the input signal terminal;

a first control circuit, coupled to the first node, the second node and a pull-up node, and configured to transmit a signal of the pull-up node to the first node in response to a signal of the second node, wherein the pull-up node is the first clock signal terminal or the second power terminal;

a second control circuit, coupled to the first node, the second node, the second power terminal and the second clock signal terminal, and configured to transmit a signal of the second power terminal to the second node in response to signals of the first node and the second clock signal terminal;

a first output circuit, coupled to the second power terminal, the first output terminal and the first node, and configured to transmit the signal of the second power terminal to the first output terminal in response to a signal of the first node;

a second output circuit, coupled to the second clock signal terminal, the second node and the first output terminal, and configured to transmit a signal of the second clock signal terminal to the first output terminal in response to the signal of the second node;

a first storage circuit, coupled to the first node; and a second storage circuit, coupled to the second node, wherein the first input circuit comprises:

a first transistor, wherein a first electrode of the first transistor is coupled to the first power terminal, a second electrode of the first transistor is coupled to the first node, and a gate of the first transistor is coupled to the first clock signal terminal;

the second input circuit comprises:

a second transistor, wherein a first electrode of the second transistor is coupled to the first power terminal, a second electrode of the second transistor is coupled to the second node, and a gate of the second transistor is coupled to the input signal terminal;

the first control circuit comprises:

a third transistor, wherein a first electrode of the third transistor is coupled to the pull-up node, a second electrode of the third transistor is coupled to the first node, and a gate of the third transistor is coupled to the second node;

the second control circuit comprises:

a fourth transistor, wherein a first electrode of the fourth transistor is coupled to the second power terminal, and a gate of the fourth transistor is coupled to the first node; and a fifth transistor, wherein a first electrode of the fifth transistor is coupled to a second electrode of the fourth transistor, a second electrode of the fifth transistor is coupled to the second node, and a gate of the fifth transistor is coupled to the second clock signal terminal;

the first output circuit comprises:

a sixth transistor, wherein a first electrode of the sixth transistor is coupled to the second power terminal, a second electrode of the sixth transistor is coupled to the first output terminal, and a gate of the sixth transistor is coupled to the first node;

the second output circuit comprises:

a seventh transistor, wherein a first electrode of the seventh transistor is coupled to the second clock signal terminal, a second electrode of the seventh transistor is coupled to the first output terminal, and a gate of the seventh transistor is coupled to the second node;

the first storage circuit comprises:

a first capacitor, coupled between the second power terminal and the first node; and the second storage circuit comprises:

a second capacitor, coupled between the second node and the first output terminal;

wherein the first output terminal of the shift register unit in the gate driving circuit is configured to provide a gate driving signal to the P-type switching transistor, and the second output terminal of the shift register unit in the gate driving circuit is configured to provide the gate driving signal to the N-type switching transistor.

17. A shift register unit, comprising:

a first shift register circuit, coupled to a signal terminal group and a first output terminal, and configured to output a first shift signal to the first output terminal in response to a signal of the signal terminal group; and a second shift register circuit, coupled with the first shift register circuit, wherein the second shift register circuit is coupled to the same signal terminal group as the first shift register circuit and a second output terminal, and is configured to output a second shift signal to the second output terminal in response to the signal of the signal terminal group;

wherein an active level of the first shift signal and an active level of the second shift signal are logically opposite;

wherein the signal terminal group comprises an input signal terminal, a first clock signal terminal, a second clock signal terminal, a first power terminal and a second power terminal;

the first shift register circuit comprises:

a first input circuit, coupled to the first power terminal, the first clock signal terminal and a first node, and configured to transmit a signal of the first power terminal to the first node in response to a signal of the first clock signal terminal;

a second input circuit, coupled to the first clock signal terminal, the input signal terminal and a second node, and configured to transmit a signal of the input signal terminal to the second node in response to the signal of the first clock signal terminal;

a first control circuit, coupled to the first node, the second node and the first clock signal terminal, and configured to transmit the signal of the first clock signal terminal to the first node in response to a signal of the second node;

a second control circuit, coupled to the first node, the second node, the second power terminal and the second clock signal terminal, and configured to transmit a signal of the second power terminal to the second node in response to signals of the first node and the second clock signal terminal;

a first output circuit, coupled to the second power terminal, the first output terminal and the first node, and configured to transmit the signal of the second power terminal to the first output terminal in response to a signal of the first node;

a second output circuit, coupled to the second clock signal terminal, the second node and the first output terminal, and configured to transmit a signal of the second clock signal terminal to the first output terminal in response to the signal of the second node;

a first storage circuit, coupled to the first node; and a second storage circuit, coupled to the second node;

wherein the first input circuit comprises:

a first transistor, wherein a first electrode of the first transistor is coupled to the first power terminal, a second electrode of the first transistor is coupled to the first node, and a gate of the first transistor is coupled to the first clock signal terminal;

the second input circuit comprises:

a second transistor, wherein a first electrode of the second transistor is coupled to the input signal terminal, a second electrode of the second transistor is coupled to the second node, and a gate of the second transistor is coupled to the first clock signal terminal;

the first control circuit comprises:

a third transistor, wherein a first electrode of the third transistor is coupled to the first clock signal terminal, a second electrode of the third transistor is coupled to the first node, and a gate of the third transistor is coupled to the second node;

the second control circuit comprises:

a fourth transistor, wherein a first electrode of the fourth transistor is coupled to the second power terminal, and a gate of the fourth transistor is coupled to the first node; and a fifth transistor, wherein a first electrode of the fifth transistor is coupled to a second electrode of the fourth transistor, a second electrode of the fifth transistor is coupled to the second node, and a gate of the fifth transistor is coupled to the second clock signal terminal;

the first output circuit comprises:

a sixth transistor, wherein a first electrode of the sixth transistor is coupled to the second power terminal, a second electrode of the sixth transistor is coupled to the first output terminal, and a gate of the sixth transistor is coupled to the first node;

the second output circuit comprises:

a seventh transistor, wherein a first electrode of the seventh transistor is coupled to the second clock signal terminal, a second electrode of the seventh transistor is coupled to the first output terminal, and a gate of the seventh transistor is coupled to the second node;

the first storage circuit comprises:

a first capacitor, coupled between the second power terminal and the first node; and the second storage circuit comprises:

a second capacitor, coupled between the second node and the first output terminal.

18. A gate driving circuit, comprising the shift register unit according to claim 17.

* * * * *